(12) United States Patent
Kang et al.

(10) Patent No.: US 6,687,173 B2
(45) Date of Patent: Feb. 3, 2004

(54) CIRCUIT FOR TESTING FERROELECTRIC CAPACITOR IN FRAM

(75) Inventors: Hee Bok Kang, Daejeon (KR); Hun Woo Kye, Kyonggi-do (KR); Duck Ju Kim, Cheju-do (KR); Je Hoon Park, Kyonggi-do (KR); Geun Il Lee, Kyonggi-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 9 days.

(21) Appl. No.: 10/166,613

(22) Filed: Jun. 12, 2002

(65) Prior Publication Data

US 2003/0002368 A1 Jan. 2, 2003

(30) Foreign Application Priority Data

Jun. 29, 2001 (KR) .......................... P2001-38131

(51) Int. Cl.[7] .......................... G11C 29/00; G11C 11/22
(52) U.S. Cl. ................................. 365/201; 365/145
(58) Field of Search ................... 365/201, 145

(56) References Cited

U.S. PATENT DOCUMENTS

| | | | |
|---|---|---|---|
| 5,598,366 A | | 1/1997 | Kraus et al. ............... 365/145 |
| 5,680,344 A | * | 10/1997 | Seyyedy .................... 365/145 |
| 5,751,628 A | | 5/1998 | Hirano et al. ............. 365/145 |
| 5,991,189 A | | 11/1999 | Miwa ........................ 365/145 |
| 6,008,659 A | * | 12/1999 | Traynor ..................... 324/658 |
| 6,031,755 A | * | 2/2000 | Ozawa ....................... 365/145 |
| 6,055,200 A | | 4/2000 | Choi et al. ................. 365/201 |
| 6,069,817 A | | 5/2000 | Shin et al. ................. 365/145 |
| 6,114,861 A | * | 9/2000 | Takeo ........................ 324/658 |
| 6,512,686 B2 | * | 1/2003 | Miyamoto ................ 365/145 |

FOREIGN PATENT DOCUMENTS

| | | |
|---|---|---|
| JP | 8-22692 | 1/1996 |
| JP | 11-102600 | 4/1999 |
| JP | 11-353898 | 12/1999 |

\* cited by examiner

*Primary Examiner*—Richard Elms
*Assistant Examiner*—Jung Hur
(74) *Attorney, Agent, or Firm*—Morgan, Lewis & Bockius LLP

(57) ABSTRACT

A circuit for testing a ferroelectric capacitor in a FRAM includes: a test pulse signal generating part; a digital test pulse providing part, responsive to the test pulse signal; an n-bit counter, responsive to the digital test pulse signal as a clock signal; a measuring control signal providing part; a write pulse bar signal generating part; an input drive control part for receiving a reference voltage signal, a voltage signal at the first electrode of the ferroelectric capacitor, the measuring control signal, and the write pulse bar signal, and applying a driving voltage to the second electrode of the ferroelectric capacitor in response to the test pulse signal, and a measured result forwarding part for receiving the reference voltage signal and the voltage signal from the first electrode, and amplifying and forwarding a voltage variation between the electrodes of the ferroelectric capacitor.

32 Claims, 20 Drawing Sheets

CIRCUIT FOR TESTING FERROELECTRIC CAPACITOR IN FRAM

The present invention claims the benefit of Korean Patent Application No. P2001-38131 filed in Korea on Jun. 29, 2001, which is hereby incorporated by reference.

BACKGROUND OF THE INVENTION

1. Field of the Invention

The present invention relates to a ferroelectric memory, and more particularly, to a circuit for testing a ferroelectric capacitor in a ferroelectric random access memory (FRAM) which measures variations of a current and a voltage at the ferroelectric capacitor in the FRAM for providing an accurate ferroelectric model parameter.

2. Background of the Invention

The FRAM, having in general a data processing speed similar to a DRAM(Dynamic Random Access Memory), and being capable of conserving data even if the power is turned off, is paid attention as a next generation memory. The FRAM, a memory having a structure similar to the DRAM, is provided with a capacitor of a ferroelectric material for utilizing a high residual polarization of the ferroelectric material. The residual polarization permits the conservation of a data even after removal of an electric field.

A related art FRAM will be explained, with reference to the attached drawings. FIG. 1 illustrates a characteristic curve of a hysteresis loop of a general ferroelectric material.

Referring to FIG. 1, it can be known that a polarization induced by an electric field is, not erased totally, but, a certain amount('d' or 'a' state) of which is remained, even if the electric field is removed owing to existence of the residual polarization(or spontaneous polarization). The 'd' and 'a' states are corresponded to '1' and '0' respectively in application to a memory.

FIG. 2 illustrates a basic sawyer tower circuit.

Referring to FIG. 2, the sawyer tower has a sense capacitor connected to the ferroelectric capacitor which is an object of measurement in series. In order to make an accurate measurement of voltage variation at the ferroelectric capacitor, a capacitance of the sense capacitor is made great for inducing most of voltage drop at the ferroelectric capacitor. Because a small sized sense capacitor is not adequate to measure the voltage drop at the ferroelectric capacitor. A drive voltage is applied to a drive terminal, and the voltage drop at the ferroelectric capacitor is measured at both electrode terminals of the sense capacitor. That is, voltages at the both electrodes of the sense capacitor are sensed, to detect a voltage change at the ferroelectric capacitor.

FIG. 3 illustrates a block diagram showing a measuring apparatus, measuring cable, and a measuring device with a probe.

Referring to FIG. 3, a measured signal is received at the measuring apparatus through a return terminal, wherein the measured signal is delayed due to a parasitic capacitance and/or a parasitic resistance at the return terminal, and distorted as the measured signal is exposed to noise sources. Therefore, there is a limitation in fast speed measuring a voltage variation of the ferroelectric capacitor.

However, the related art circuit for testing a ferroelectric capacitor in a FRAM has the following problems.

For obtaining accurate modeling parameters of a ferroelectric capacitor in a FRAM, measurements of ferroelectric capacitor characteristics should be possible. In the meantime, the ferroelectric capacitor has very great time dependences on phenomena, such as degradation, and relaxation, and the like, caused by imprint, and fatigue, etc., to exhibit characteristic variations even within a minute time period. The related art circuit for measuring a ferroelectric capacitor has limitations in a capacitor size, or a measuring time period due to noise sources affecting the return terminal. There has been no device that can measure such time dependences on degradation, relaxation, and the like accurately yet, and, with respect to a measurable capacitor size, measurement of a memory of a cell size level is not possible, but measurement of a memory of only a large size level is possible. Therefore, it is difficult to provide model parameters having accurate ferroelectric characteristics reflected thereto.

SUMMARY OF THE INVENTION

Accordingly, the present invention is directed to a circuit for testing a ferroelectric capacitor in a ferroelectric random access memory that substantially obviates one or more of the problems due to limitations and disadvantages of the related art.

An object of the present invention is to provide a circuit for testing a ferroelectric capacitor in a ferroelectric random access memory, which can measure variations of current and voltage at a ferroelectric capacitor in an FRAM, for providing accurate ferroelectric model parameters.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a circuit for testing a ferroelectric capacitor in a ferroelectric random access memory (FRAM) for storing a data at the ferroelectric capacitor includes a test pulse signal generating part for generating a test pulse signal for measuring variation of charge in the ferroelectric capacitor, a test pulse providing part for digitizing the test pulse signal by using a reference voltage signal to provide a digital test pulse signal, an n-bit counter for making a $2^n$ clock counting per a cycle in response to the digital test pulse signal as a clock signal, a measuring control signal providing part for subjecting count outputs for each bit, and the digital test pulse signal to logic operation, to provide a measuring control signal, a write pulse bar signal generating part for generating a write pulse bar signal in correspondence to a specific bit count output within a specific period, an input drive control part for receiving the reference voltage signal, a voltage signal at the first electrode of the ferroelectric capacitor, the measuring control signal, the write pulse bar signal, and applying a driving voltage to a second electrode of the ferroelectric capacitor in response to the test pulse signal, and a measured result forwarding part for receiving the reference voltage signal, and the voltage signal from the first electrode at a non-inversion terminal, and an inversion terminal thereof respectively, and amplifying, and forwarding a voltage variation between the electrodes of the ferroelectric capacitor.

In another aspect, a circuit for testing a ferroelectric capacitor in an FRAM for storing data in the ferroelectric capacitor includes a test pulse signal generating part for generating a test pulse signal for measuring variation of charge in the ferroelectric capacitor, a test pulse providing part for digitizing the test pulse signal by using a reference voltage signal to provide a digital test pulse signal, an n-bit counter for making a $2^n$ clock counting per a cycle in response to the digital test pulse signal as a clock signal, a measuring control signal providing part for subjecting count outputs for each bit, and the digital test pulse signal to logic operation, to provide a measuring control signal, a write pulse bar signal generating part for generating a write pulse bar signal in correspondence to a specific bit output within a specific period, an input drive control part for receiving the reference voltage signal, a voltage signal of the first electrode of the ferroelectric capacitor, the measuring control signal, and the write pulse bar signal, and providing a drive voltage to a second electrode of the ferroelectric capacitor in response to the test pulse signal, a measured result forwarding part for receiving the reference voltage signal, and the voltage signal from the first electrode at a non-inversion terminal, and an inversion terminal thereof respectively, and amplifying, and forwarding a voltage variation between the electrodes of the ferroelectric capacitor, and a sense capacitor connected between the first electrode of the ferroelectric capacitor, and the measured result forwarding part for sensing voltage variation of the ferroelectric capacitor.

In another aspect, a circuit for testing a ferroelectric capacitor in an FRAM for storing data in the ferroelectric capacitor includes a test pulse signal generating part for generating a test pulse signal for measuring variation of charge in the ferroelectric capacitor, a test pulse providing part for digitizing the test pulse signal by using a reference voltage signal to provide a digital test pulse signal, an n-bit counter for making a $2^n$ clock counting per a cycle in response to the digital test pulse signal as a clock signal, a measuring control signal providing part for subjecting count outputs for each bit, and the digital test pulse signal to logic operation, to provide a measuring control signal, a write pulse bar signal generating part for generating a write pulse bar signal in correspondence to a specific bit output within a specific period, an input drive control part for receiving the reference voltage signal, a voltage signal of the first electrode of the ferroelectric capacitor, the measuring control signal, and the write pulse bar signal, and providing a drive voltage to a second electrode of the ferroelectric capacitor in response to the test pulse signal, a measured result forwarding part for receiving the reference voltage signal, and the voltage signal from the first electrode at a non-inversion terminal, and an inversion terminal thereof respectively, and amplifying, and forwarding a voltage variation between the electrodes of the ferroelectric capacitor, and a sense resistor connected between the non-inversion terminal, and the inversion terminal of the amplification part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
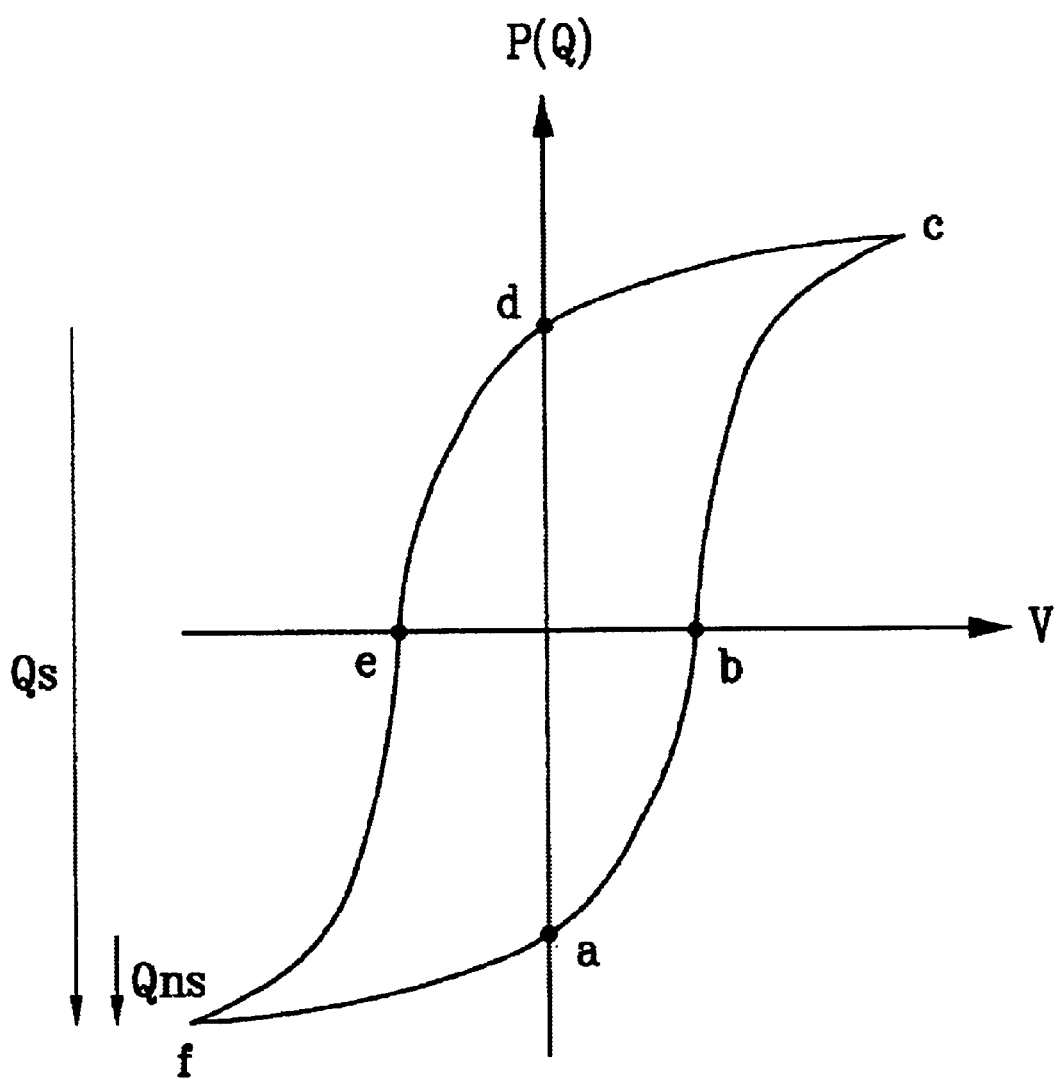
FIG. 1 illustrates a characteristic curve of a hysteresis loop of a general ferroelectric material.
Figure 2:
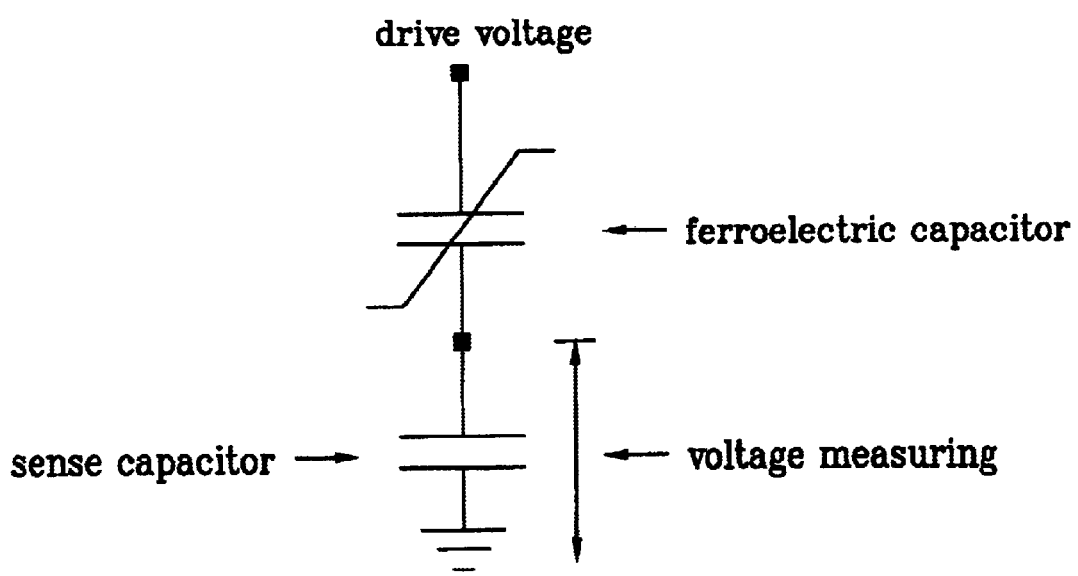
FIG. 2 illustrates a basic sawyer tower circuit.
Figure 3:
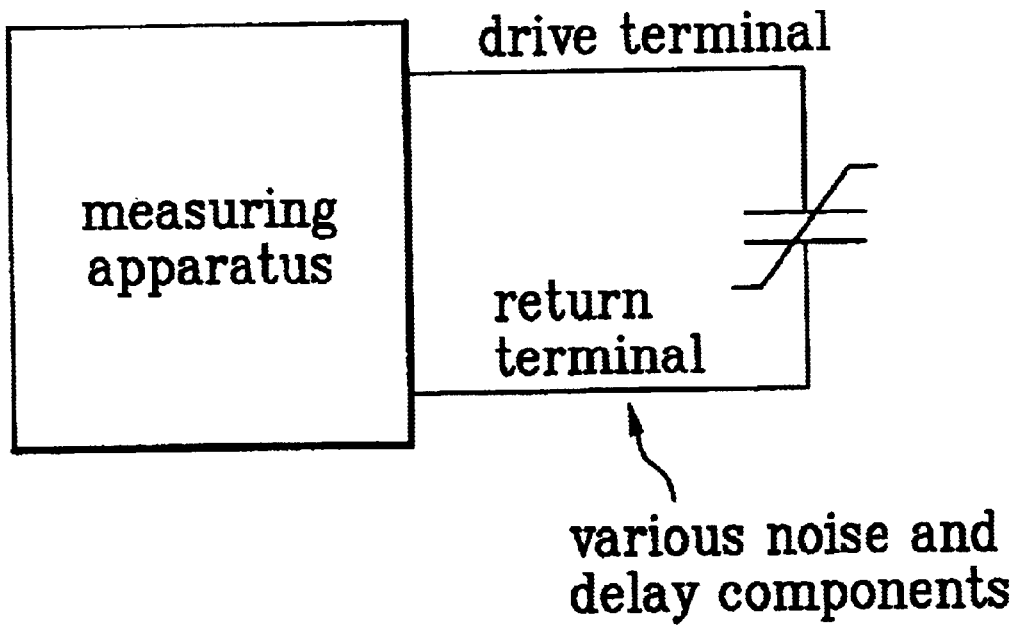
FIG. 3 illustrates a block diagram of an apparatus for measuring a ferroelectric capacitor in an FRAM, schematically.
Figure 4:
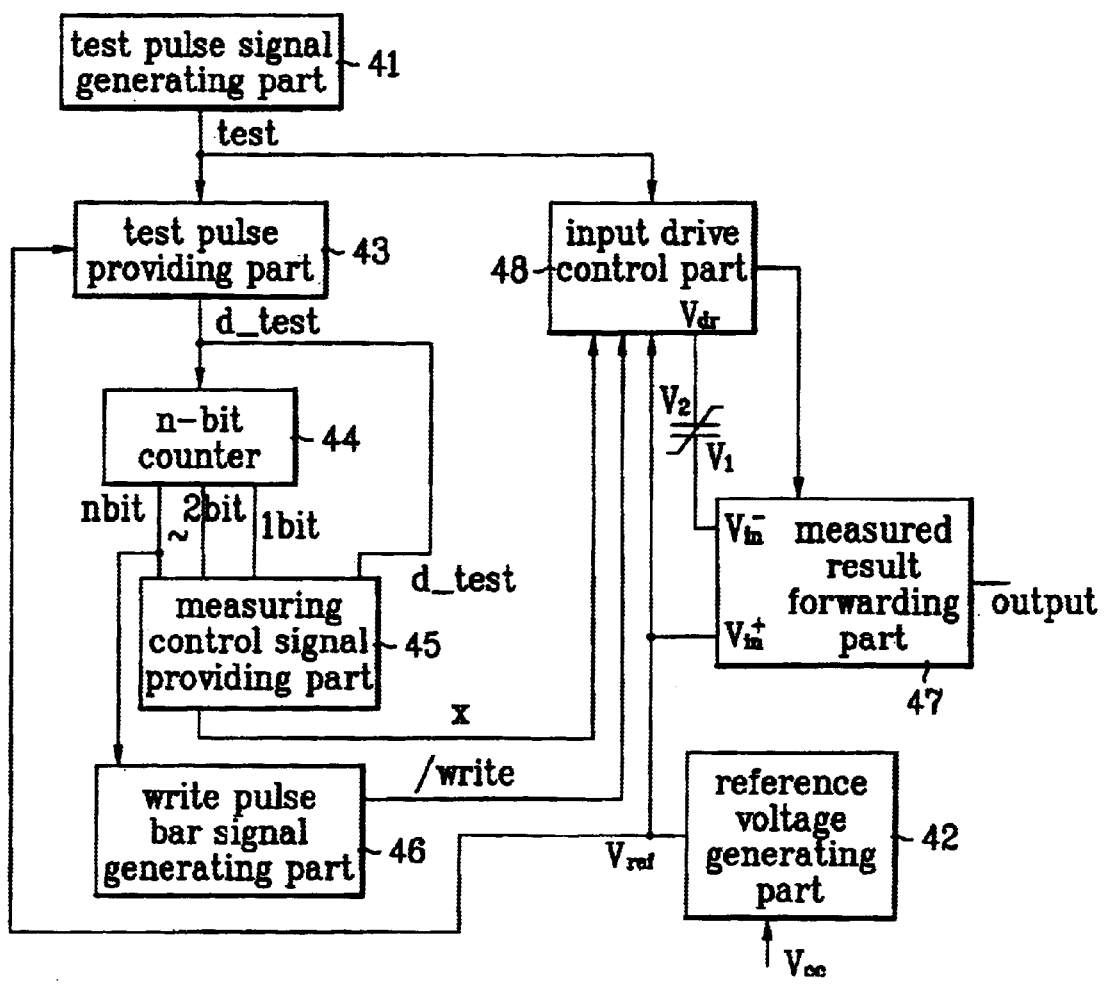
FIG. 4 illustrates a block diagram of an exemplary circuit for testing a ferroelectric capacitor in an FRAM according to the present invention.

Reference will now be made in detail to the preferred embodiments of the present invention, examples of which are illustrated in the accompanying drawings. FIG. 4 illustrates a block diagram of a circuit for testing a ferroelectric capacitor in an FRAM in accordance with a preferred embodiment of the present invention.

Referring to FIG. 4, the circuit for testing a ferroelectric capacitor in an FRAM in accordance with a preferred embodiment of the present invention includes a test pulse signal generating part 41 for generating a test pulse signal 'test' for measuring variation of charge in the ferroelectric capacitor, a reference voltage generating part 42 for receiving an external power source voltage Vcc, to generate a reference voltage Vref, a test pulse providing part 43 for digitizing the test pulse signal 'test' with reference to the reference signal Vref to provide a digital test pulse signal d_test, an n-bit counter 44 for making a $2^n$ clock counting per a cycle in response to the digital test pulse signal d_test as a clock signal, a measuring control signal providing part 45 for subjecting an output of each bit from the n-bit counter, and the digital test pulse signal d_test to logical operation, a pulse bar signal generating part 46 for generating a write pulse bar signal /write to a specific bit output among the outputs of the n-bit counter, a measured result forwarding part 47 for receiving the reference voltage Vref, and a voltage signal from a first electrode V1 of the ferroelectric capacitor, and sensing, and forwarding a voltage variation between electrodes of the ferroelectric capacitor, and an input drive control part 48 for receiving a reference voltage signal Vref, the voltage signal of the first electrode V1 of the ferroelectric capacitor, the measuring control signal 'x', the write pulse bar signal /write, the test pulse signal 'test', and applying a driving voltage Vdr to a second electrode V2 of the ferroelectric capacitor.

The circuit for testing a ferroelectric capacitor in an FRAM in accordance with a preferred embodiment of the present invention is operative in two modes of a data write mode and a test mode. In the data write mode, the drive voltage Vdr is applied to the second electrode V2 of the ferroelectric capacitor as the write pulse bar signal /write, and, in the test mode, the drive voltage Vdr is applied to the second electrode V2 of the ferroelectric capacitor as the test pulse signal 'test'. That is, the circuit for testing a ferroelectric capacitor in an FRAM in accordance with a preferred embodiment of the present invention is operative in the data write mode, or the test mode depending on the drive voltage Vdr.

Functions of different parts of the circuit for testing a ferroelectric capacitor in an FRAM in accordance with a preferred embodiment of the present invention will be explained.

The test pulse signal generating part 41 may be disposed inside, or outside of a chip. For an example, a pulse generator, such as a quartz oscillator, is employed for implementing the test mode in which capacitor characteristics are obtained. The reference voltage generating part 42 receives a power source voltage Vcc from outside of the circuit, and generates the reference voltage signal Vref, which serves as a reference in comparison of all voltages in the capacitor circuit in the test mode. The reference voltage generating part 42 provides the reference voltage Vref to be one half ½ Vcc of the external power source voltage Vcc. The test pulse signal 'test' from the test pulse signal generating part 41 has an analog waveform. Therefore, it is necessary to convert such an analog signal 'test' to a digital signal d_test for implementing a stable circuit in the test mode. The test pulse providing part 43 converts the test pulse signal 'test' generated as an analog signal to a digital test pulse signal d_test. The test pulse providing part 43 is operative with reference to the reference voltage Vref form the reference voltage providing part 42.

Figure 5:
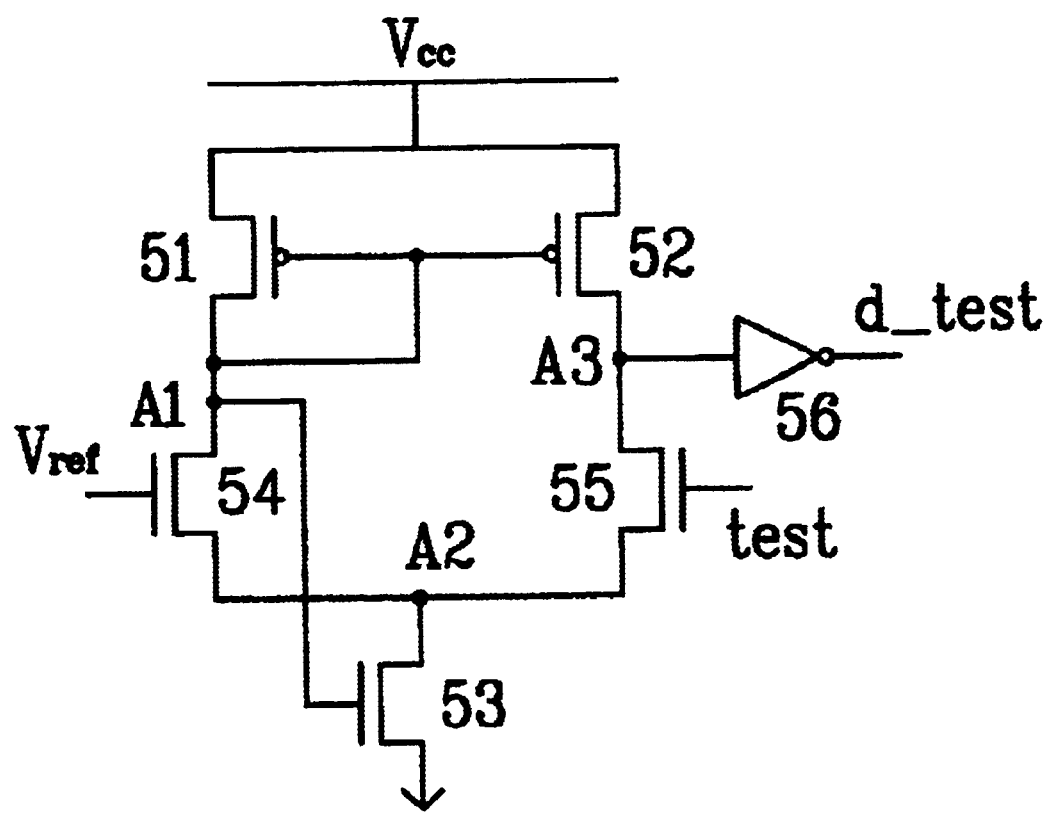
FIG. 5 illustrates a circuit of the test pulse providing part in FIG. 4.

FIG. 5 illustrates a circuit of the test pulse providing part in FIG. 4.

An A-D converter is employed as the test pulse providing part, inclusive of a first PMOS transistor 51 connected to the power source voltage in a diode type, a second PMOS transistor 52 connected to the first PMOS transistor 51 in a current mirror type, a first NMOS transistor 53 connected between a ground voltage Vss and a second node A2, and controlled by an output of a first node A1 which is a drain terminal of the first PMOS transistor 51, a second NMOS transistor 54 connected between the first node A1 and the second node A2, and controlled by an output of the reference voltage Vref, a third NMOS transistor 55 connected between a third node A3 which is a drain terminal of the second PMOS transistor 52, and the second node A2, and controlled by the test pulse signal 'test', and an inverter 56 for inverting an output of the third node A3 to provide the digital test pulse signal d_test. That is, the test pulse providing part provides the digital test pulse signal d_test, in a high level if the test pulse signal 'test' is higher than the reference voltage signal Vref, and in a low level if the test pulse signal 'test' is lower than the reference voltage signal Vref. The ½ Vcc reference voltage Vref makes the digital pulse signal d_test to have the same high level, and low level widths.

Figure 6:
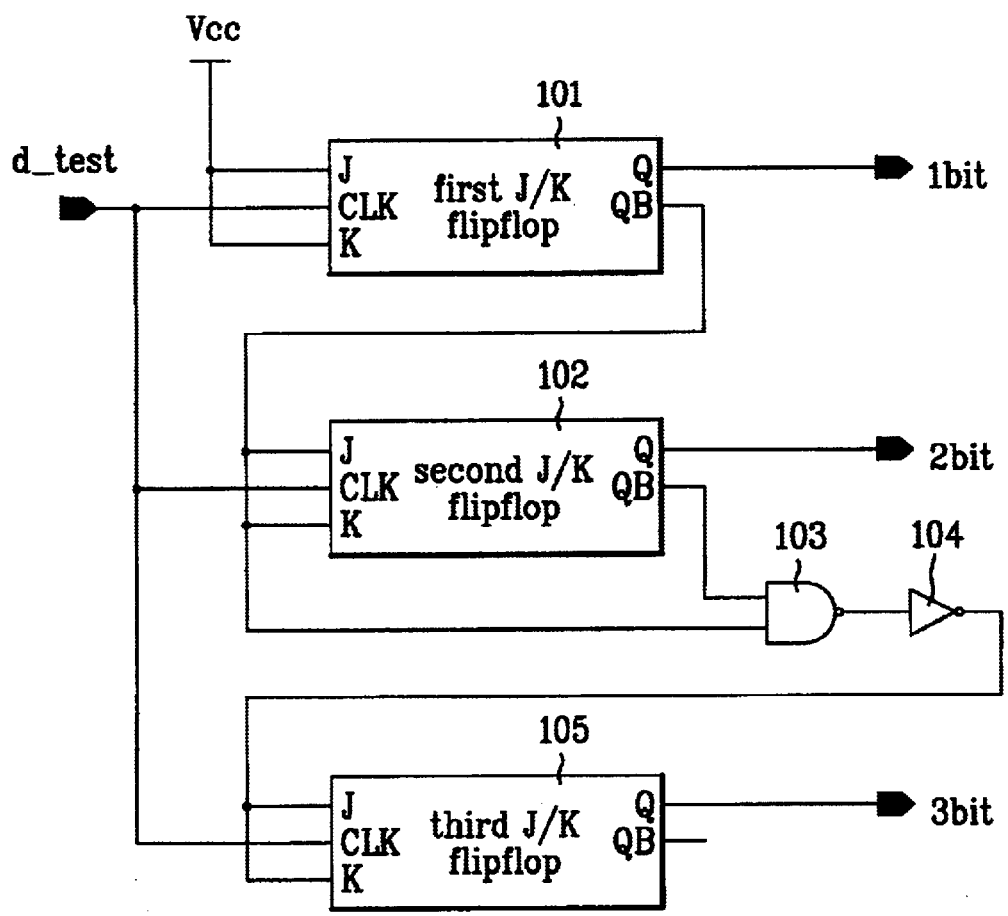
FIG. 6 illustrates a block diagram of the 3-bit counter in FIG. 4.

FIG. 6 illustrates a block diagram of the 3-bit counter 44 in FIG. 4. The n-bit counter of this embodiment will be explained based on 3 bit down counter.

Referring to FIG. 6, the 3 bit down counter makes counting operation in response to the digital test pulse signal d_test from the test pulse providing part used as a clock signal CLK. One turn of the n-bit counting requires $2^n$ clock, which is call as one cycle. The 3 bit down counter includes a first J/K flipflop 101 for receiving the power source voltage Vcc at J/K input terminals respectively, and providing one bit signal in response to the clock signal CLK, a second J/K flipflop 102 for receiving an inverted signal of the one bit signal at J/K input terminals respectively, and providing two bit signal in response to the clock signal CLK, an NAND gate 103 for subjecting an inverted signal of the one bit signal, and an inverted signal of the two bit signal to negative logical product, an inverter 104 for inverting an output from the NAND gate 103, and a third J/K flipflop 105 for receiving an output from the inverter 104 at J/K input terminals respectively, and providing a 3 bit signal in response to the clock signal.

Figure 7:
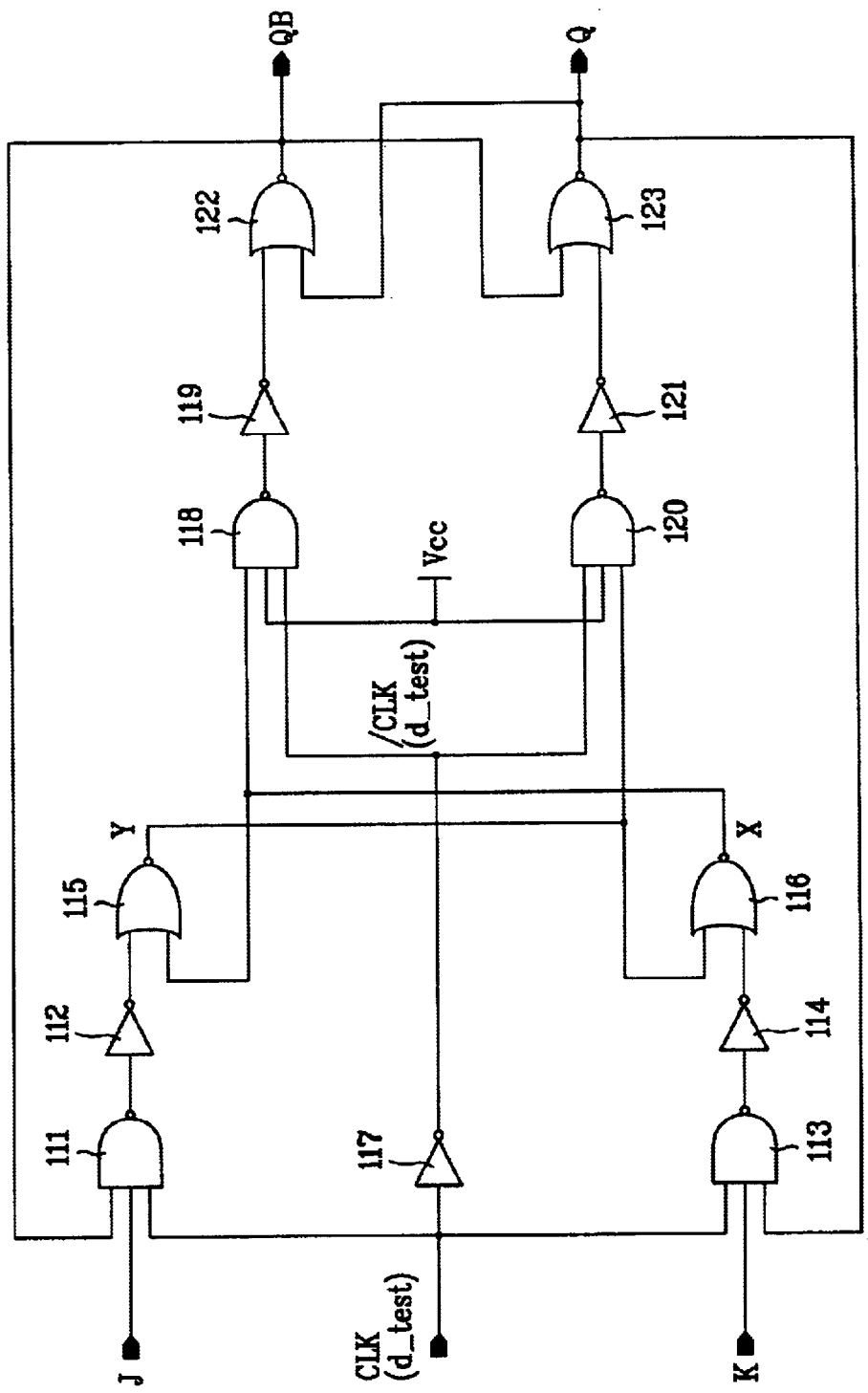
FIG. 7 illustrates a logic circuit of the J/K flipflop in FIG. 6.

FIG. 7 illustrates a circuit diagram of a logic circuit of the J/K flipflop in FIG. 6.

Referring to FIG. 7, the J/K flipflop includes a first NAND gate 111 for subjecting the clock signal CLK, the J input signal 'J', and the fed back negative output 'QB' to negative logical product, a first inverter 112 for inverting an output from the first NAND gate 111, a second NAND gate 113 for subjecting the clock signal CLK, the K input signal 'K', and the fed back positive output Q to logical product, a second inverter 114 for inverting an output of the second NAND gate 113, a first NOR gate 115 for subjecting an output from the first inverter 112, and the first signal 'X' to negative logic sum, to provide a second signal 'Y', a second NOR gate 116 for subjecting the second signal 'Y' and an output from the second inverter to negative logic sum, to provide the first signal 'X', a third inverter 117 for inverting the clock signal CLK to provide an inverted clock signal /CLK, a third NAND gate 118 for subjecting the first signal 'X', the inverted clock signal CLK, and the power source signal Vcc to negative logic product, a fourth inverter 119 for inverting an output from the third NAND gate 118, a fourth NAND gate 120 for subjecting the second signal 'Y', the inverted clock signal /CLK, the power source voltage signal Vcc to negative logic product, a fifth inverter 121 for inverting an output from the fourth NAND gate 120, a third NOR gate 122 for subjecting an output from the fourth inverter 119 and the positive output 'Q' to negative logic sum, to provide the negative output 'QB', and a fourth NOR gate for subjecting an output from the fifth inverter 121 and the negative output 'QB' to negative logic sum, to provide the positive output 'Q'.

The J/K inputs to the J/K flipflop are always the same, to provide total cases of all the inputs are at a low level, or all the inputs are at a high level. As the clock signal CLK, the digital test pulse signal d_test from the test pulse providing part is used. The third inverter 117 inverts the clock signal CLK, and the third, fourth NAND gates 118, and 120 are operative synchronous to the inverted signal /CLK of the clock signal CLK. As the digital pulse signal d_test is used as the clock signal CLK, the inverted signal /CLK of the clock signal CLK is the digital inverted signal /d_test. That is, the J/K flipflop has an output signal alternating from a high level to a low level, and vice versa, synchronous to the clock inversion signal '/CLK' when the signals both to the J/K terminals are at high. The J/K flipflop having three of such a J/K flop connected serves as a three bit down counter; i.e., makes 8 times of clock counting from (H-H-H) to (L-L-L) per one cycle by using the digital test signal.

Figure 8:
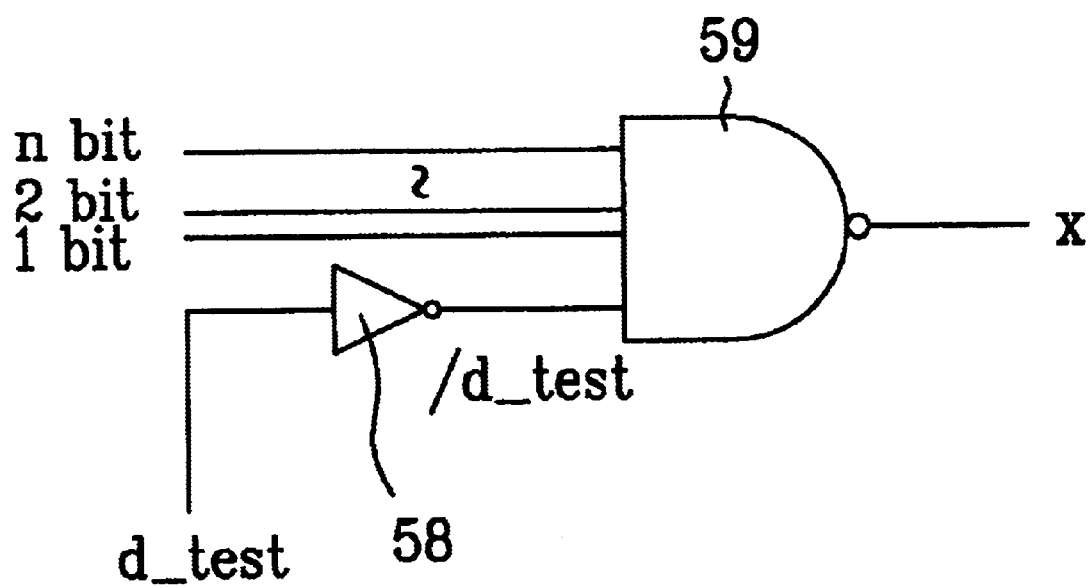
FIG. 8 illustrates a logic circuit of the measuring control signal providing part in FIG. 4.

FIG. 8 illustrates a logic circuit of the measuring control signal providing part 45 in FIG. 4.

Referring to FIG. 8, the measuring control signal providing part subjects n outputs from the n-bit counter and the digital test pulse signal d_test to logic sum, to provide, and apply an output to the input drive control part as a measuring control signal 'x'. The measuring control signal providing part includes an inverter 58 for inverting the digitized test pulse signal d_test to provide a digital inverted signal /d_test, and an NAND gate 59 for subjecting the n outputs from the n bit counter and the digital inverted signal d_test to negative logical product. The measuring control signal providing part serves for detecting a time point when both n outputs from the n bit counter, and the digital inverted signal /d_test are at high.

Figure 9:
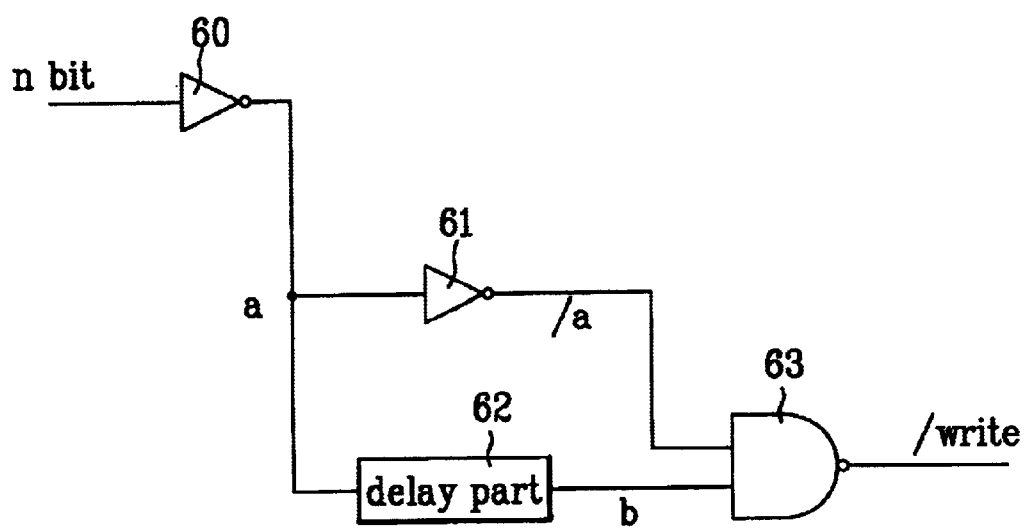
FIG. 9 illustrates a block diagram of the write pulse bar signal generating part in FIG. 4.

FIG. 9 illustrates a block diagram of the write pulse bar signal generating part in FIG. 4.

Referring to FIG. 9, the write pulse bar signal generating part includes a first inverter 60 for inverting the most significant bit output (n bits) from the n bit counter, a second inverter 61 for inverting an output 'a' of the first inverter 60, a delay part 62 for delaying the output 'a' from the first inverter 60, and an NAND gate 63 for subjecting an output '/a' from the second inverter 62 and an output 'b' from the delay part to negative logic product, to provide a write pulse inverted signal/pul_write. The write pulse bar signal generating part, synchronous to the most significant bit signal, serves to provide a write pulse bar signal /write at a low level for a preset time period. For sustaining the write pulse bar signal 'write' for a preset time period, the delay part and the NAND gate are employed. The write pulse bar signal '/write' is varied within ½ clock of the digital pulse signal d_test.

Figure 10:
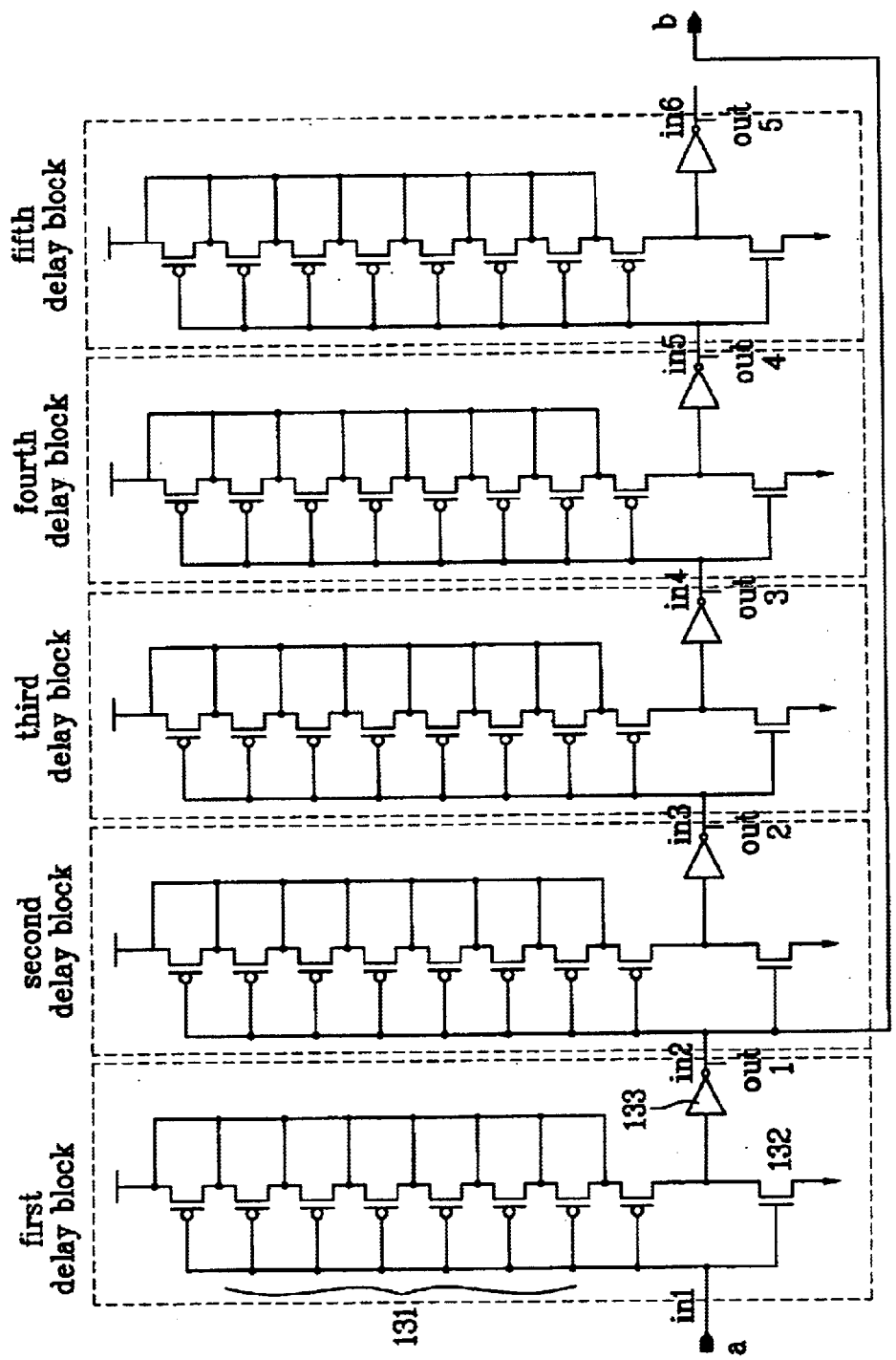
FIG. 10 illustrates a circuit diagram of the delay part in FIG. 9.

FIG. 10 illustrates a circuit diagram of the delay part 62 in FIG. 9.

Referring to FIG. 10, the delay part includes a plurality of delay blocks connected in series each having an output terminal connected to a selection signal for setting delay time periods different from one another. In FIG. 10, the delay part has five delay blocks, and an output signal is taken at the first delay block. That is, an output from the first inverter 60 in FIG. 9 is taken as an input signal in1 to the delay part, and an output 'b' from the delay part is taken at an output terminal on the first delay block. If it is desired to have a longer delay period, the output 'b' from the delay part may be taken at an output terminal on one of the later delay blocks. Since the delay blocks are identical, a time delay each delay block can provide is also identical.

Each of the delay blocks includes a plurality of PMOS transistors connected in series from a power source voltage controlled by an input signal 'in', one NMOS transistor connected between a drain of a last PMOS transistor among the plurality of PMOS transistors, and a ground power source, and an inverter for inverting an output from a contact point between the last PMOS transistor and the NMOS transistor. When the output 'a' from the first inverter 60 is at low, the output signal 'b' is at high delayed for a preset time period through the plurality of PMOS transistors 131, and the inverter 133 in the delay part. In FIG. 10, when the output 'in1' from the first inverter 60 is at high, the delay part provides a low level output signal 'out1' inverted through the NMOS transistor 132, and the inverter 133. The output 'b' from the inverter 133 is provided to the NAND gate 63 together with the output '/a' from the second inverter 61 in FIG. 9. When both of the input signal '/a', and 'b' are at high, the write pulse bar signal '/write' is sustained for a time period the low level signal is delayed through the plurality of PMOS transistors 131.

Figure 11:
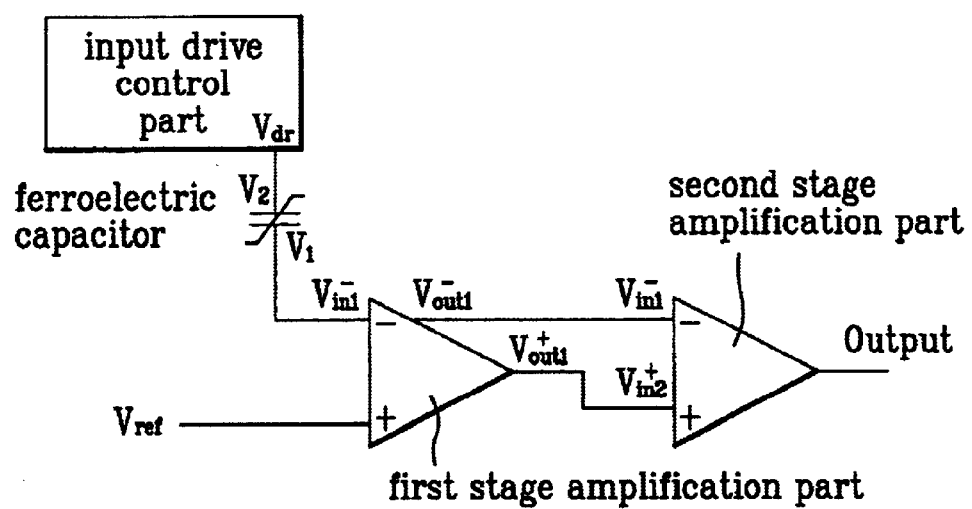
FIG. 11 illustrates a block diagram of the measured result forwarding part in FIG. 4.

FIG. 11 illustrates a block diagram of the measured result forwarding part 47 in FIG. 4.

Referring to FIG. 11, the measured result forwarding part 47 includes a two state amplification part, inclusive of a first amplification part for receiving the reference voltage Vref, and a voltage at the first electrode V1 of the ferroelectric capacitor, for sensing voltage variation between electrodes of the ferroelectric capacitor, and a second amplification part for providing the voltage between the electrodes of the ferroelectric capacitor to outside of the circuit without any noise source.

Figure 12:
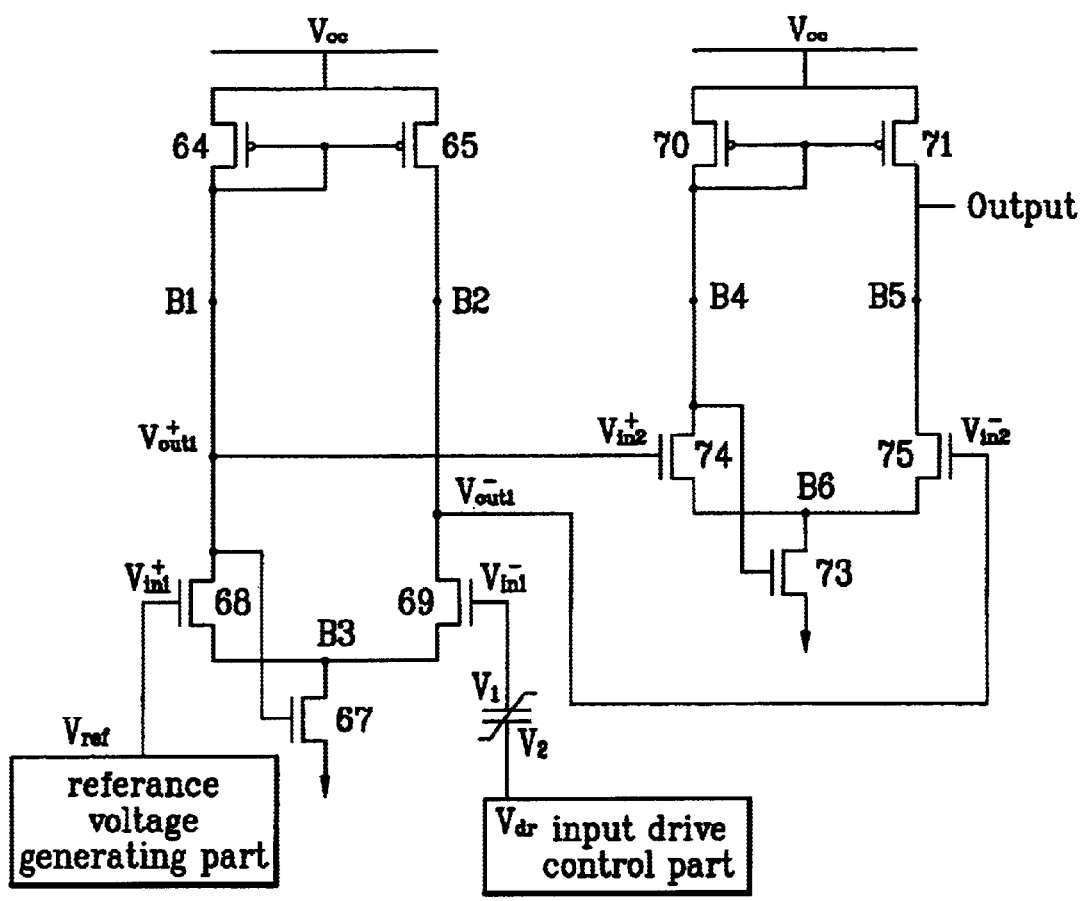
FIG. 12 illustrates circuit diagram of a detail circuit of FIG. 11.

FIG. 12 illustrates circuit diagram of a detail circuit of FIG. 11.

Referring to FIG. 12, the first amplification part includes a first PMOS transistor 64 connected in a diode type from the power source voltage Vcc, a second PMOS transistor 65 connected to the first PMOS transistor 64 in a current mirror type, a first NMOS transistor 67 connected between a third node B3, and a ground power source Vss, and controlled by an output from a first node B1, a second NMOS transistor 68 connected between the first node B1 and the third node B3, and controlled by the reference voltage Vref, and a third NMOS transistor 69 connected between a second node B2 which is a drain terminal of the second PMOS transistor 65, and the third node B3, and controlled by a voltage of the first electrode V1 of the ferroelectric capacitor.

The second amplification part includes a fourth PMOS transistor 70 connected in a diode type from the power source voltage Vcc, a fifth PMOS transistor 71 connected to the fourth PMOS transistor 70 in a current mirror type, a fourth NMOS transistor 73 connected between a sixth node B6, and a ground power source Vss, and controlled by an output from a fourth node B4, a fifth NMOS transistor 74 connected between the fourth node B4 and the sixth node B6, and controlled by an output from the first node B1, and a sixth NMOS transistor 75 connected between a fifth node B2 which is a drain terminal of the fifth PMOS transistor 71, and the sixth node B6, and controlled by an output of the second node B2.

A gate of the second NMOS transistor 68 serves as a non-inversion input terminal $V^+_{in1}$ of the first amplification part, and a gate of the third NMOS transistor 69 serves as an inversion input terminal $V^-_{in1}$ of the first amplification part($V^+_{in1}=V^+_{in}$, and $V^-_{in1}=V^-_{in}$). The reference voltage Vref is provided to the positive input terminal $V^+_{in1}$ of the first amplification part, and a first electrode V1 voltage of the ferroelectric capacitor is provided to the negative input terminal $V^-_{in1}$, for obtaining the first, and second signals $V^+_{out1}$ and $V^-_{out1}$ at the first, and second nodes B1, and B2, respectively. A gate of the fifth NMOS transistor 74 serves as a non-inversion input terminal $V^+_{in2}$ of the second amplification part, and a gate of the sixth NMOS transistor 75 serves as an inversion input terminal $V^-_{in2}$ of the second amplification part. The second amplification part receives the first signal $V^+_{out1}$, and the second signal $V^-_{out1}$ from the first node B1, and the second node B2, output terminals of the first amplification part, at the non-inversion input terminal $V^+_{in2}$, and the negative input terminal $V^-_{in2}$, respectively, and provides an output from the fifth node B5 ($V^+_{out1}=V^+_{in2}$, and $V^-_{out1}=V^-_{in2}$).

The measured result forwarding part has the following function.

When a voltage provided to the third NMOS transistor 69 from the first electrode V1 of the ferroelectric capacitor is lower than the reference voltage Vref, a current $I_1$ to the second NMOS transistor 68 is greater than a current $I_2$ to the third NMOS transistor 69. Since currents to the first PMOS transistor, and to the second NMOS transistor 68 are the same, a voltage (Vcc–$I_1*R_{p1}$, where $R_{p1}$ denotes a resistance at the first PMOS transistor) at the first node B1 is lower than a voltage (Vcc–$I_2*R_{p2}$) at the second node B2 (it is assumed that identical sizes of PMOS transistors are used). Accordingly, a voltage to the fifth NMOS transistor 74 is lower than a voltage to the sixth NMOS transistor 75, a voltage at the fifth node B5, an output terminal of the sixth NMOS transistor 75, is lower than a voltage to the fourth node B4. That is, the output signal is a signal having a voltage dropped from a provided signal to a preset extent due to the two stage of the amplification part. Opposite to this, when the voltage provided to the third NMOS transistor 69 from the first electrode V1 of the ferroelectric capacitor is higher than the reference voltage Vref, the output signal is a signal amplified to a preset extent through the two stage of the amplification part. That is, the measured result forwarding part compares the voltage from the first electrode $V_1$ of the ferroelectric capacitor to the reference voltage Vref, and forwards the amplified voltage to outside of the circuit when the voltage from the first electrode V1 is higher than the reference voltage Vref, and the voltage dropped voltage to outside of the circuit when the voltage from the first electrode V1 is lower than the reference voltage Vref. The output signal from the measured result forwarding part is fixed according to a signal provided to the negative input terminal of the amplification part. The signal provided to the negative input terminal of the amplification part is a voltage signal at the first electrode V1 of the ferroelectric capacitor, which is a driving voltage Vdr from the input drive control part.

Figure 13:
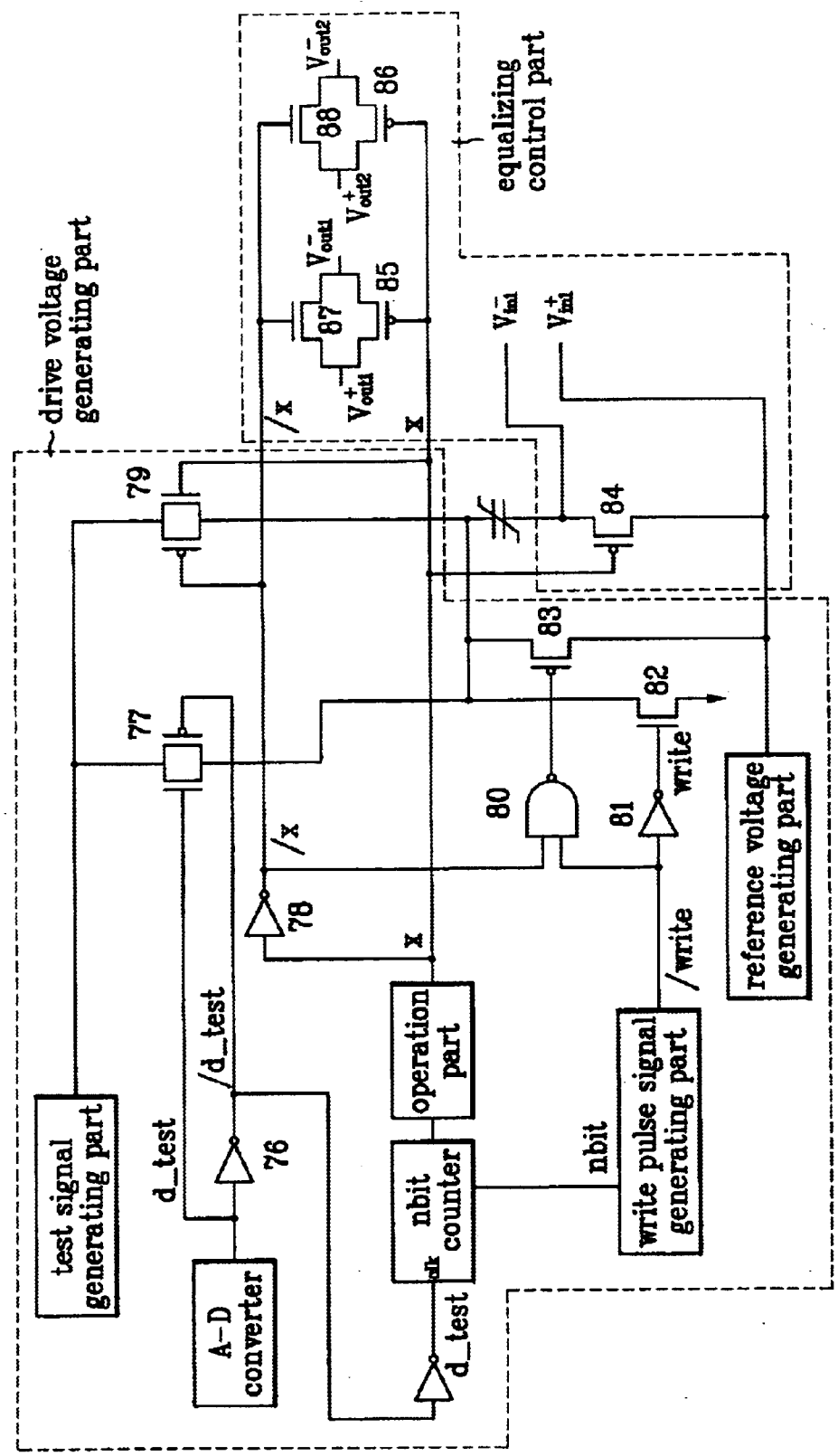
FIG. 13 illustrates a circuit diagram of the input driving control part in FIG. 4.

Referring to FIG. 13, the input drive control part includes a drive voltage generating part for providing a drive voltage to the second electrode of the ferroelectric capacitor, and an equalizing control part for equalizing control between the non-inversion input terminal, and the inversion input terminal of the amplification part.

The drive voltage generating part includes a first inverter 76 for inverting the digital test pulse signal d_test to provide a digital inversion signal '/d_test', a first transfer gate 77 having an NMOS transistor with the digital test pulse signal d_test applied thereto, and a PMOS transistor with the digital inversion signal '/d_test' applied thereto, for providing the test pulse signal 'test' to a second electrode V2 of the ferroelectric capacitor when the first transfer gate 77 is turned on, a second inverter 78 for inverting a measuring control signal 'x' from the measuring control signal providing part to provide a control inversion signal '/x', a second transfer gate 79 having a PMOS transistor with the control inversion signal '/x' applied thereto, and an NMOS transistor with the measuring control signal 'x' applied thereto, for providing the test pulse signal 'test' to a second electrode V2 of the ferroelectric capacitor when the second transfer gate 79 is turned on, an NAND gate 80 for subjecting the control inversion signal '/x', and the write pulse bar signal '/write' to negative logic product, a third inverter 81 for inverting the write pulse bar signal '/write' to provide a write pulse signal 'write', a first NMOS transistor 82 connected between the second electrode V2 of the ferroelectric capacitor and the ground voltage Vss, and controlled by the write pulse signal 'write', and a first PMOS transistor 83 connected between the second electrode V2 of the ferroelectric capacitor and the reference voltage application terminal, for being controlled by an output from the NAND gate 80.

The diving voltage generating part receives the test signal 'test' selectively through the first, and second transfer gates 77, and 79, or the ground voltage Vss through the first NMOS transistor 82, or the reference voltage Vref through the first PMOS transistor 83, for providing the driving voltage Vdr provided to the second electrode V2 of the ferroelectric capacitor.

The driving voltage generating part is operative in response to above signals, as follows.

The first case is when the test signal 'test' is provided to the second electrode V2 of the ferroelectric capacitor. When the first transfer gate 77 is turned, the digital test pulse signal d_test from the A-D converter is at high, and when the second transfer gate 79 is turned on is the measuring control signal 'x' which is an output from the measuring control signal providing part is at high. In this instance, the test signal 'test' is provided to the second electrode V2 of the ferroelectric capacitor.

The second case is when the ground voltage is provided to the second electrode V2 of the ferroelectric capacitor. When a low write pulse bar signal '/write' is provided from the write pulse bar signal generating, the write pulse signal 'write' from the third inverter 81 is at high, and the first NMOS transistor 82 is turned on, to provide the ground voltage Vss to the second electrode V2 of the ferroelectric capacitor.

The third case is when the reference voltage Vref is provided to the second electrode V2 of the ferroelectric capacitor. This is a case when the NAND gate 80 which subjects the control inversion signal '/x' and the write pulse bar signal '/write' to negative logic product provides a low level signal, i.e., when the measuring control signal 'x' is at low, and the write pulse bar signal '/write' is at high, i.e., a case the write pulse signal 'write' is at low under a state both the 'n' outputs from the n bit counter, and the digital inversion signal '/d_test' are at high. This is a case of relaxation after generation of the write pulse bar signal '/write' for a time period within a data writable section.

The equalizing control part in the input drive control part includes a second PMOS transistor 84 connected between a reference voltage application terminal, and the second electrode V2 of the ferroelectric capacitor, and controlled by the measuring control signal 'x', a third PMOS transistor 85, and a second NMOS transistor 87 connected between the positive, and negative output terminals $V^+_{out1}$, and $V^-_{out1}$ of the first amplification part, and controlled by the measuring control signal 'x', and a fourth PMOS transistor 86, and a third NMOS transistor 88 connected between the positive, and negative output terminals $V^+_{out2}$, and $V^-_{out2}$ of the second amplification part, and controlled by the control inverted signal '/x'. As explained, the reference voltage generating part generates a half (½ Vcc) of the external power source voltage Vcc.

Figure 14:
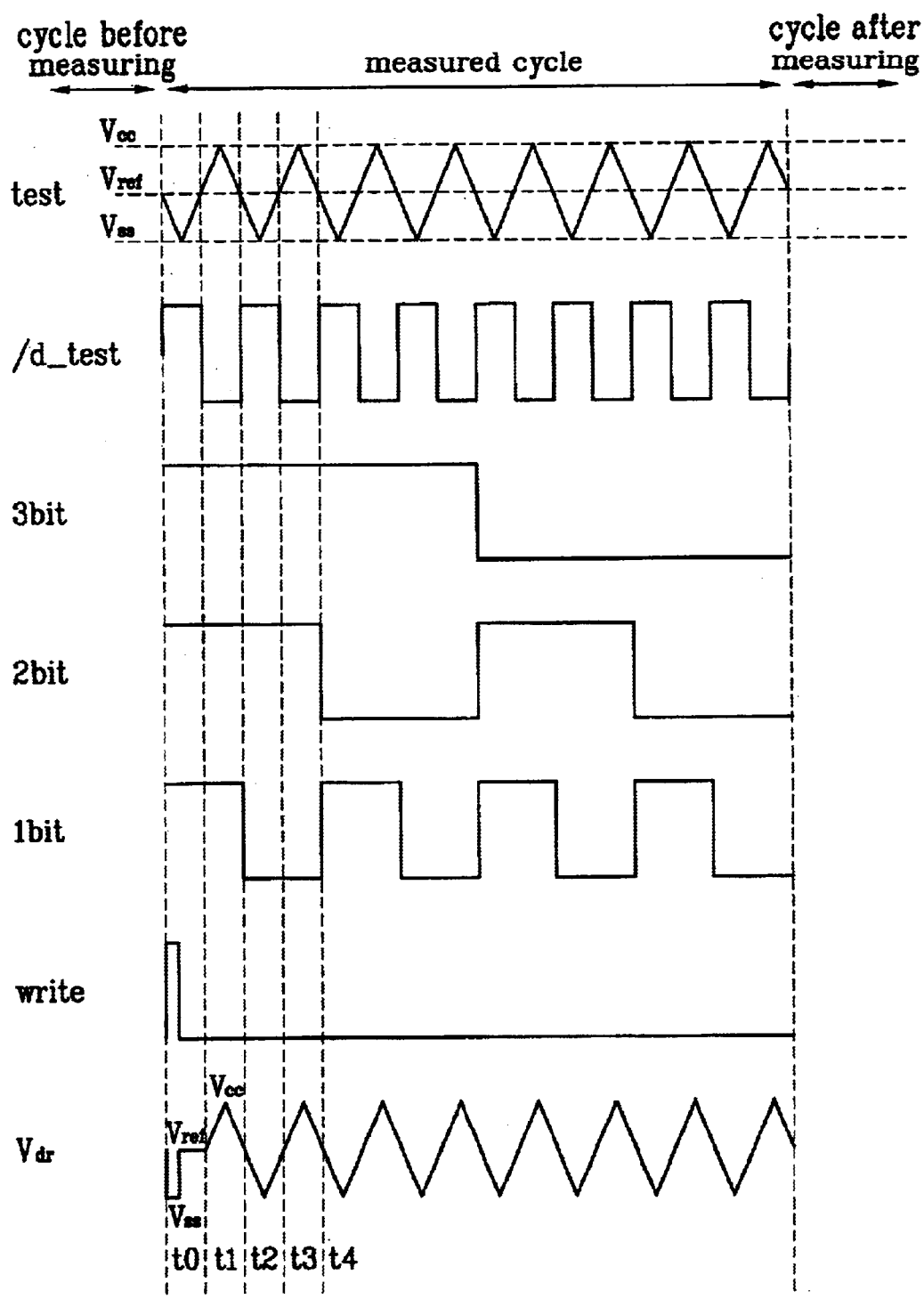
FIG. 14 illustrates a timing diagram showing waveforms of signals at respective blocks in the circuit in FIG. 4.
Figure 15:
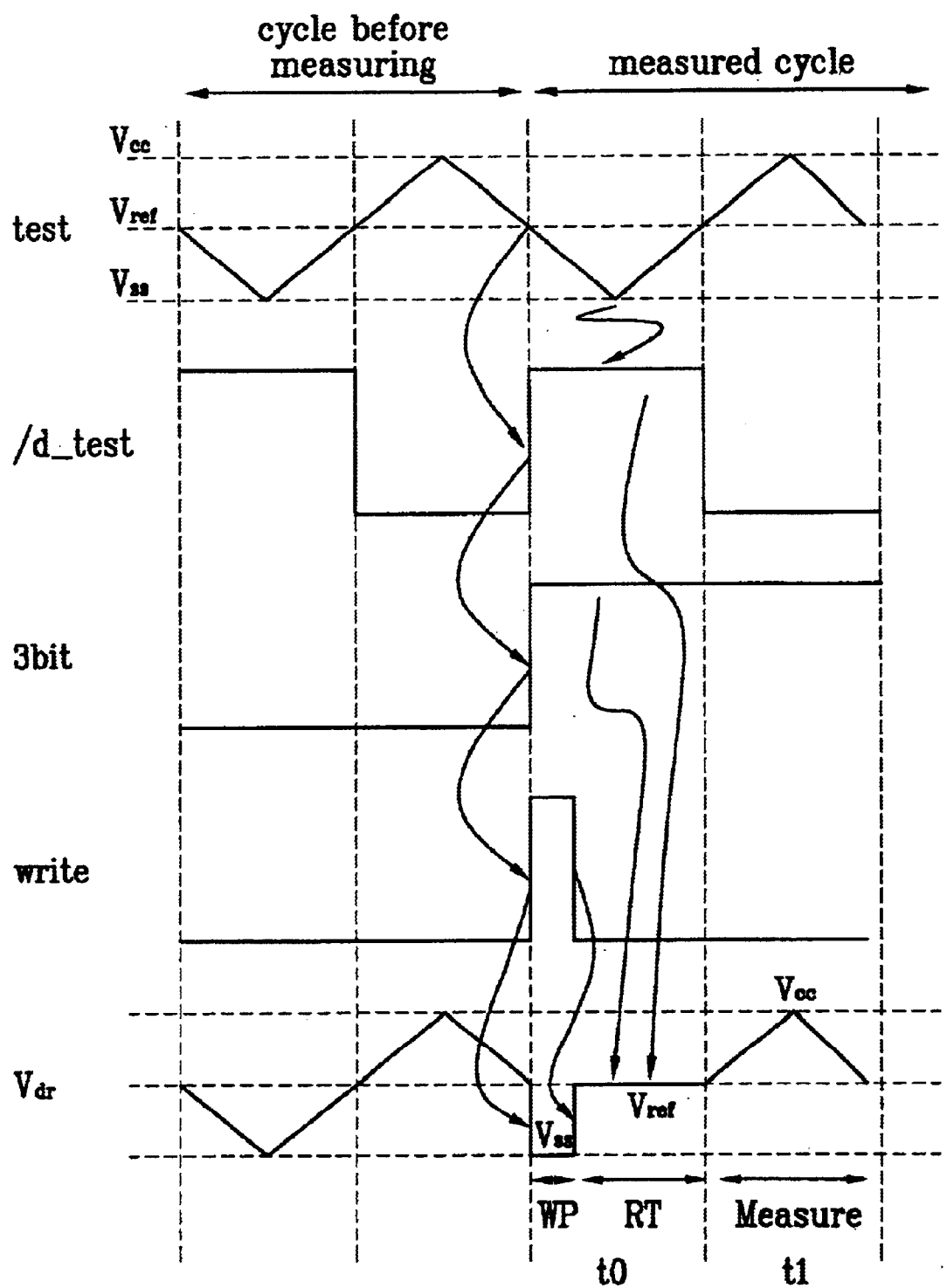
FIG. 15 illustrates a timing diagram showing detail of a relation between the test signal and the driving voltage in FIG. 14.

FIG. 14 illustrates a timing diagram showing waveforms of signals at respective blocks in the circuit in FIG. 4, and FIG. 15 illustrates a timing diagram showing detail of a relation between the test signal and the driving voltage in FIG. 14.

Referring to FIG. 14, in the circuit for testing a ferroelectric capacitor in an FRAM, the test pulse signal providing part 41, and the write pulse bar signal generating part 46 generate the test pulse signal 'test', and the write pulse signal '/write' respectively, and to provide the driving voltage Vdr from the input drive control part 48, finally.

Behaviors of different signals at different blocks will be explained.

At first, when the test pulse signal 'test' is provided to the A-D converter, the A-D converter provides the digital test pulse signal d_test. The 3 bit down counter 44 provides 1, 2, 3 bit signals in response to an inversion signal of the digital pulse signal d_test, i.e., the digital inversion signal '/d_test'. In this instance, as the 3 bit down counter 44 makes down counting, the 3, 2, and 1 bit signals from the 3 bit down counter 44 transits from an H-H-H state to an L-L-L state. The write pulse bar signal generating part 46 generates the write pulse bar signal '/write' synchronous to the 3 bit signal, when the write pulse bar signal '/write' transits from a high level to a low level. In FIG. 14, the write pulse signal 'write' is shown, which is an inversion signal of the write pulse bar signal '/write'. The input drive control part 48 provides the driving voltage Vdr at the ground voltage level when the write pulse signal 'write' is at a high level, and at the reference voltage Vref level when the write pulse signal 'write' is at a low level. A period the drive voltage Vdr transits from the ground voltage Vss to the reference voltage Vref is a period of an initial half clock 't0' in which all the 3, 2, and 1 bit signals are at high levels, which is within ½ clock of the digital inversion signal '/d_test'.

Referring to FIG. 15, when the digital inversion signal '/d test' is at a high level, if the 3 bit signal transits from a low level to a high level, the write pulse signal 'write' transits to a low level in response to the transit of the 3 bit signal, to make a write operation 'WP'. Then, within the ½ clock 't0' where the digital inversion signal '/d_test' is at a high level continuously, the drive voltage Vdr is at the reference voltage Vref level. Then, when the digital inversion signal '/d_test' transits to a low level (after 't1'), the drive voltage Vdr has a waveform the same with the test pulse signal 'test'. As such, a period the reference voltage Vref is provided as the drive voltage Vdr is called as a relaxation time (RT).

Figure 16:
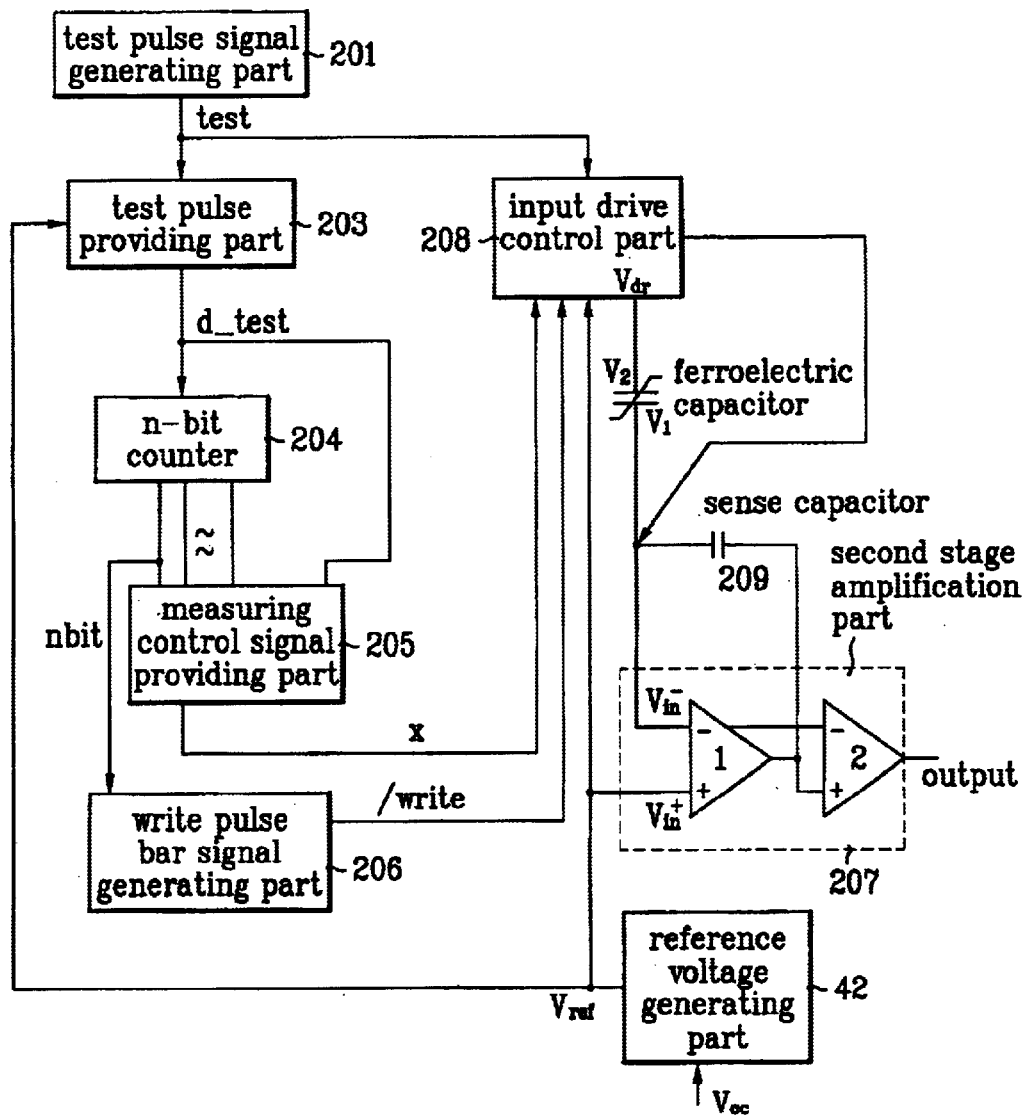
FIG. 16 illustrates a block diagram of another exemplary circuit for testing a voltage of a ferroelectric capacitor in an FRAM according to the present invention.

A voltage between electrodes of the ferroelectric capacitor, or a current to the ferroelectric capacitor can be measured by adding a specific device to the circuit for testing a ferroelectric capacitor of the present invention. FIG. 16 illustrates a block diagram of a circuit for testing a voltage of a ferroelectric capacitor in an FRAM in accordance with a preferred embodiment of the present invention.

Referring to FIG. 16, the circuit for testing a ferroelectric capacitor in an FRAM for storing data in the ferroelectric capacitor in accordance with a preferred embodiment of the present invention includes a test pulse signal generating part 201 for generating a test pulse signal 'test' for measuring variation of charge in the ferroelectric capacitor, a reference voltage generating part 202 for receiving an external power source voltage Vcc, to generate a reference voltage Vref, a test pulse providing part 203 for digitizing the test pulse signal 'test' with reference to the reference signal Vref to provide a digital test pulse signal d_test, an n-bit counter 204 for making a $2^n$ clock counting per a cycle in response to the digital test pulse signal d_test as a clock signal, a measuring control signal providing part 205 for subjecting an output of each bit from the n-bit counter, and the digital test pulse signal d_test to logic operation, a pulse bar signal generating part 206 for generating a write pulse bar signal '/write' to a specific bit output among the outputs of the n-bit counter, a measured result forwarding part 207 for receiving the reference voltage Vref, and a voltage signal from a first electrode V1 of the ferroelectric capacitor, and sensing, and forwarding a voltage variation between electrodes of the ferroelectric capacitor, an input drive control part 208 for receiving a reference voltage signal Vref, the voltage signal of the first electrode V1 of the ferroelectric capacitor, the measuring control signal 'x', the write pulse bar signal '/write', and the test pulse signal 'test', and providing a drive voltage Vdr to a second electrode V2 of the ferroelectric capacitor, and a sense capacitor 209 connected between the first electrode V1 of the ferroelectric capacitor, and the measured result forwarding part 207 for sensing voltage variation of the ferroelectric capacitor. The foregoing circuit for testing a voltage of a ferroelectric capacitor serves to measure a voltage between electrodes of the ferroelectric capacitor. The measured result forwarding part 207 includes a first amplification part for receiving the reference voltage Vref, and the voltage at the first electrode V1 of the ferroelectric capacitor, and sensing a voltage variation between the electrodes of the ferroelectric capacitor, and a second amplification part for forwarding the voltage between the electrodes of the ferroelectric capacitor without any noise sources to outside of the circuit (the measured result forwarding part in FIG. 16 has two stages of amplification parts).

Figure 17:
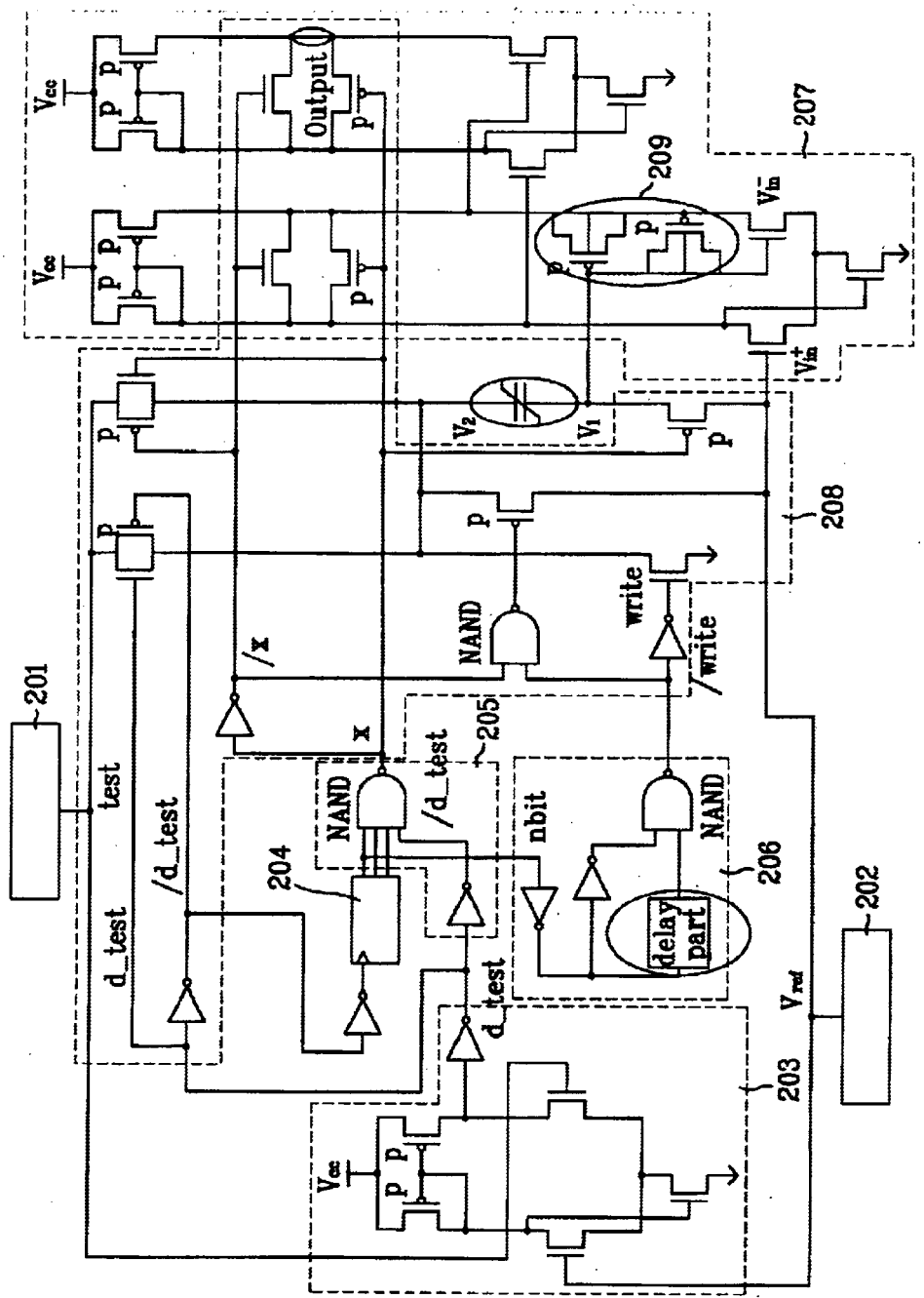
FIG. 17 illustrates a circuit diagram of the circuit in FIG. 16.

FIG. 17 illustrates a circuit diagram showing one embodiment of the block diagram in FIG. 16.

Referring to FIG. 17, the circuit is identical to the circuit for testing a voltage of a ferroelectric capacitor of the present invention in FIG. 4, added with the sense capacitor. The ferroelectric capacitor is a PMOS transistor having a gate connected to a negative input terminal $V^-_{in}$ of the amplification part 207, and source/drain for receiving the drive voltage Vdr of the input drive control part 208 in common. The test pulse providing part 203 is an A-D converter identical to one in FIG. 5, for receiving a test pulse signal 'test' as an input signal, and providing the digital test pulse signal d_test. The 3 bit down counter in FIG. 6 is employed as the n bit counter 204. The clock signal to the 3 bit down counter 204 is the digital test pulse signal d_test from the A-D converter 203. The 3 bit down counter provides signals for respective bits (1, 2, and 3 bits) synchronous to the clock inversion signal '/d_test'. The signals from the 3 bit down counter transit from H-H-H to L-L-L. The measuring control signal providing part 205 has a circuit identical to one in FIG. 8, and provides a low level signal as the measuring control signal 'x' only in a case both the signals for respective bits (1, 2, and 3 bits), and the digital inversion signal 'd_test' are at high level, and provides a high level signal in other cases. The write pulse bar signal generating part 206 has a circuit identical to one in FIG. 9, for providing a write pulse bar signal '/write' to sustain a low level as much as a preset delay time period set at the delay part in response to a rising signal of the 3 bit signal. The two stage amplification part 207 has a circuit of the two stage amplification part identical to the measured result forwarding part in FIG. 12, for receiving the reference voltage Vref at the positive input terminal $V^+_{in}$, and the voltage signal from the first electrode $V_1$ of the ferroelectric capacitor at $V^-_{in}$, and making a differential amplification of a voltage difference between the positive, and negative input terminals $V^+_{in}$, and $V^-_{in}$, to provide an output. The input drive control part 208 has a circuit as shown in FIG. 13, for generating the drive voltage Vdr, and equalizing the positive, and negative output terminals $V^+_{out}$, and $V^-_{out}$.

When the write pulse bar signal '/write' transits from a high level to a low level at the write pulse bar signal generating part, the drive voltage Vdr is provided in a waveform (a low level) the same with the write pulse bar signal '/write' in response to the digital test pulse signal d_test, the measuring control signal 'x', and the write pulse bar signal '/write', maintained at the reference voltage Vref level during a preset relaxation time period, and becomes the test pulse signal 'test'. A time period the write pulse bar signal '/write' is provided, and a time period the reference voltage Vref is provided, as the drive voltage Vdr, are within ½ clock of the digital inversion signal '/d_test' used as the clock time.

In this instance, the sense capacitor 209 feeds the output from the first amplification part of the two stage amplification part 207 back to the first electrode V1 of the ferroelectric capacitor. The sense capacitor 209 has a first electrode connected to a contact point of the first electrode $V_1$ of the ferroelectric capacitor and the inversion input terminal $V^-_{in}$ of the amplification part, and a second electrode connected to the first output terminal $V^-_{out1}$ of the first amplification part of the amplification part. Or, the sense capacitor 209 may have a system with two PMOS transistors. That is, as shown in FIG. 17, the sense capacitor 209 may have a first PMOS transistor having a gate connected to a contact point of the first electrode $V_1$ of the ferroelectric capacitor, and the inversion input terminal $V^-_{in}$ of the two stage amplification part 207, and source/drain connected to the inversion output terminal $V^-_{out1}$ of the first amplification part of the two stage amplification part 207, and a second PMOS transistor having a gate connected to the inversion output terminal $V^-_{out1}$ of the two stage amplification part 207, and source/drain connected to a contact point of the first electrode $V_1$ of the ferroelectric capacitor, and the inversion input terminal $V^-_{in}$ of the two stage amplification part 207. The amplification part provides equalized values from relevant output terminals (the positive, and negative output terminals of the first, and second amplification parts, i.e., $V^+_{out1}$, and $V^-_{out1}$ on the first amplification part, and $V^+_{out2}$, and $V^-_{out2}$ on the second amplification part) according to outputs ('x', and '/x') of the input drive control part, which is an initializing operation of the amplification part. Thereafter, the amplification part is operative in response to a signal provided newly to the positive, and negative input terminals of the amplification part.

Figure 18:
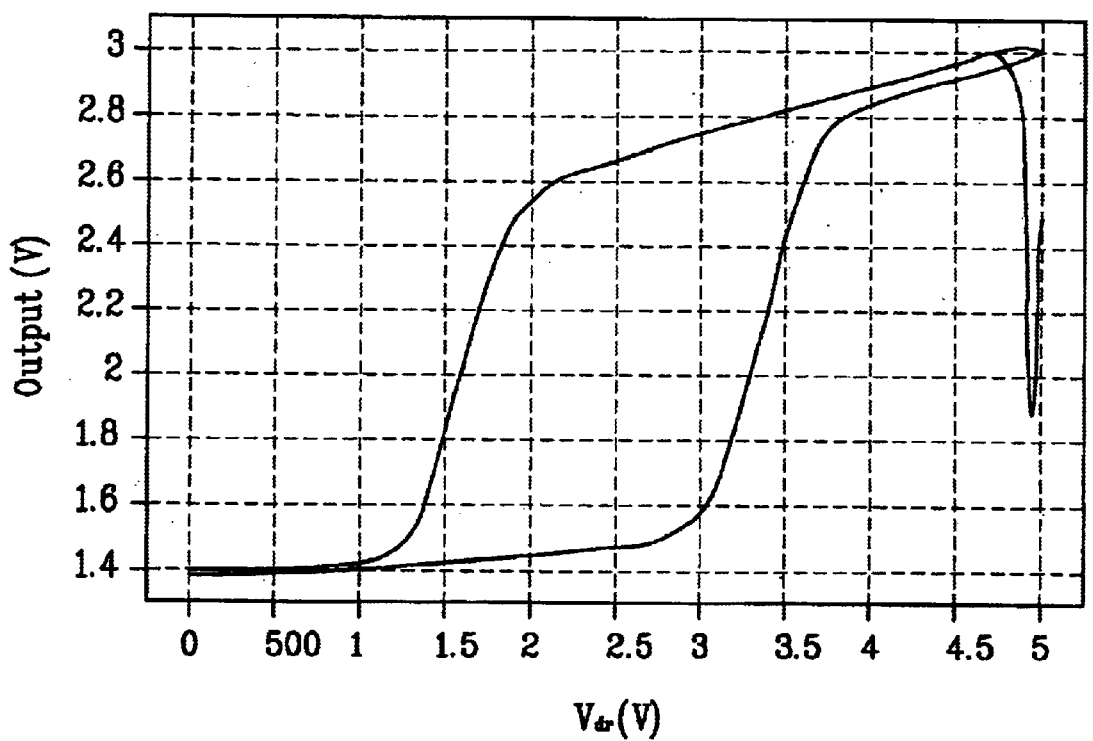
FIG. 18 illustrates a graph showing the output waveform in FIG. 16.

FIG. 18 illustrates a graph showing the output waveform in FIG. 16.

Referring to FIG. 18, it can be noted that, when the drive voltage Vdr is varied from 0V to Vcc, the output of the amplification part is changed sharply in the vicinity of the reference voltage Vref. In this instance, the reference voltage is a half of the power source voltage (½ Vcc). The power source voltage is 5V. That is, when the drive voltage is provided to the input drive control part 208 while the drive voltage is pulled up from 0V to 2.5V (½ Vcc), the output signal from the two stage amplification part 207, while the output signal shows little variation at 1.4V of the drive voltage, starts to increase sharply when the drive voltage is pulled up over 2.5V. When the drive voltage is 5V, the output signal is approx. 3V. Alikely, if the drive voltage is pulled down from 5V (Vcc) to 2.5V (½ Vcc) slowly, though the output signal shows a small variation from 3V to 2.6V, if the drive voltage is pulled down below 2.5V, the output signal shows a sharp change, to drop to a voltage in the vicinity of 1.4V. When the output signal is converted into charge, P versus Vdr shows a hysteresis loop similar to FIG. 18.

Figure 19:
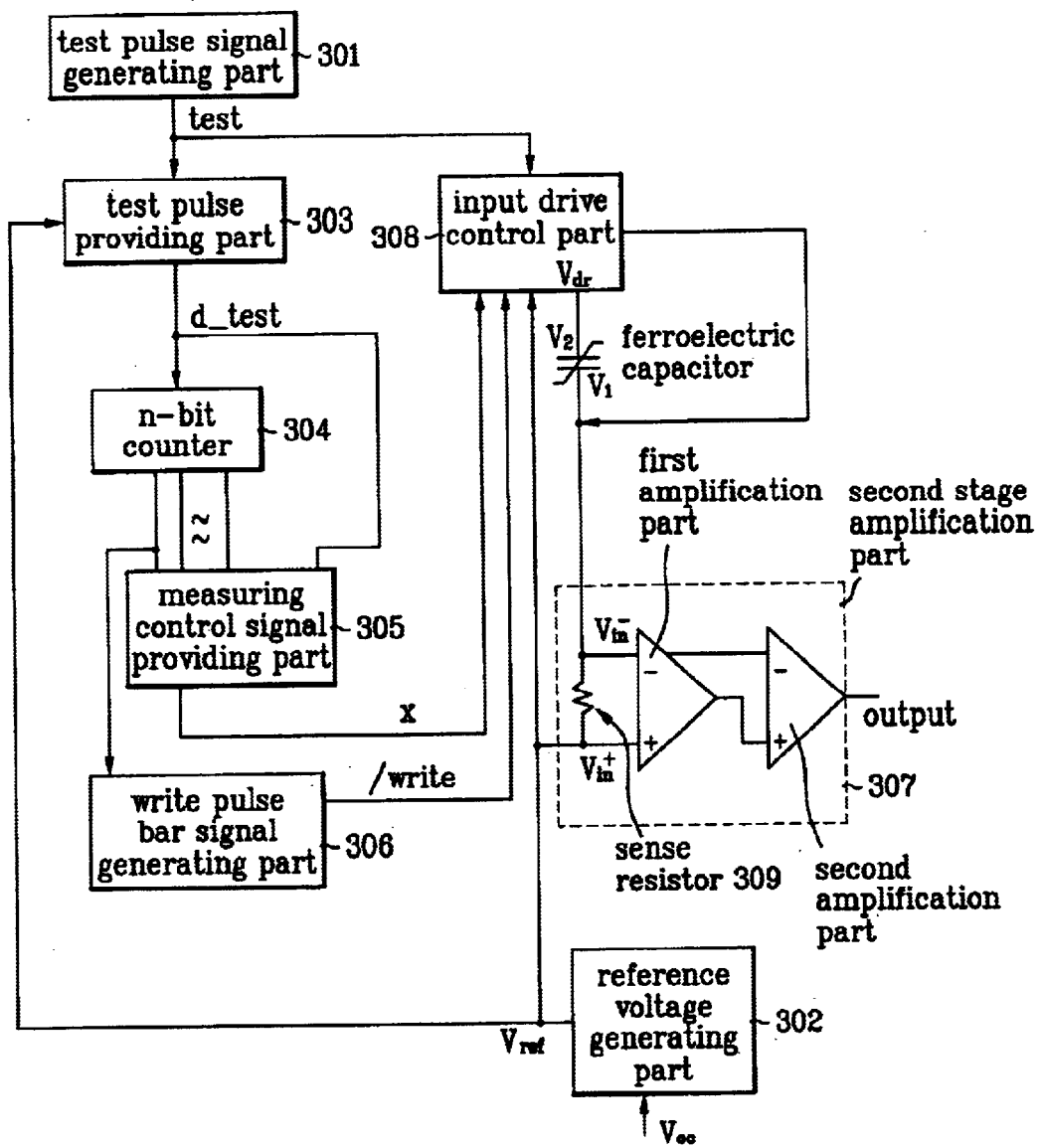
FIG. 19 illustrates a block diagram of another exemplary circuit for testing a current of a ferroelectric capacitor in an FRAM according to the present invention; and, FIG. 20 illustrates a circuit diagram of the circuit in FIG. 19.

A current variation to the ferroelectric capacitor can be measured by using the circuit for testing the ferroelectric capacitor of the present invention. FIG. 19 illustrates a block diagram of a circuit for testing a current of a ferroelectric capacitor in an FRAM in accordance with a preferred embodiment of the present invention. The circuit for testing a current to a ferroelectric capacitor illustrated in FIG. 19 serves to measure a current to the ferroelectric capacitor when a sense resister is added thereto.

Referring to FIG. 19, the circuit for testing a ferroelectric capacitor in an FRAM for storing data in the ferroelectric capacitor in accordance with a preferred embodiment of the present invention includes a test pulse signal generating part 301 for generating a test pulse signal 'test' for measuring variation of charge in the ferroelectric capacitor, a reference voltage generating part 302 for receiving an external power source voltage Vcc, to generate a reference voltage Vref, a test pulse providing part 303 for digitizing the test pulse signal 'test' with reference to the reference signal Vref to provide a digital test pulse signal d_test, an n-bit counter 204 for making a $2^n$ clock counting per a cycle in response to the digital test pulse signal d_test as a clock signal, a measuring control signal providing part 305 for subjecting an output of each bit from the n-bit counter, and the digital test pulse signal d_test to logic operation, a pulse bar signal generating part 306 for generating a write pulse bar signal '/write' to a specific bit output among the outputs of the n-bit counter, a measured result forwarding part 307 for receiving the reference voltage Vref, and a voltage signal from a first electrode V1 of the ferroelectric capacitor, and sensing, and forwarding a voltage variation between electrodes of the ferroelectric capacitor, an input drive control part 308 for receiving a reference voltage signal Vref, the voltage signal of the first electrode V1 of the ferroelectric capacitor, the measuring control signal 'x', the write pulse bar signal '/write', and the test pulse signal 'test', and providing a drive voltage Vdr to a second electrode V2 of the ferroelectric capacitor, and a sense resistor 309 connected between the non-inversion input terminal, and the inversion input terminal of the amplification part.

Figure 20:
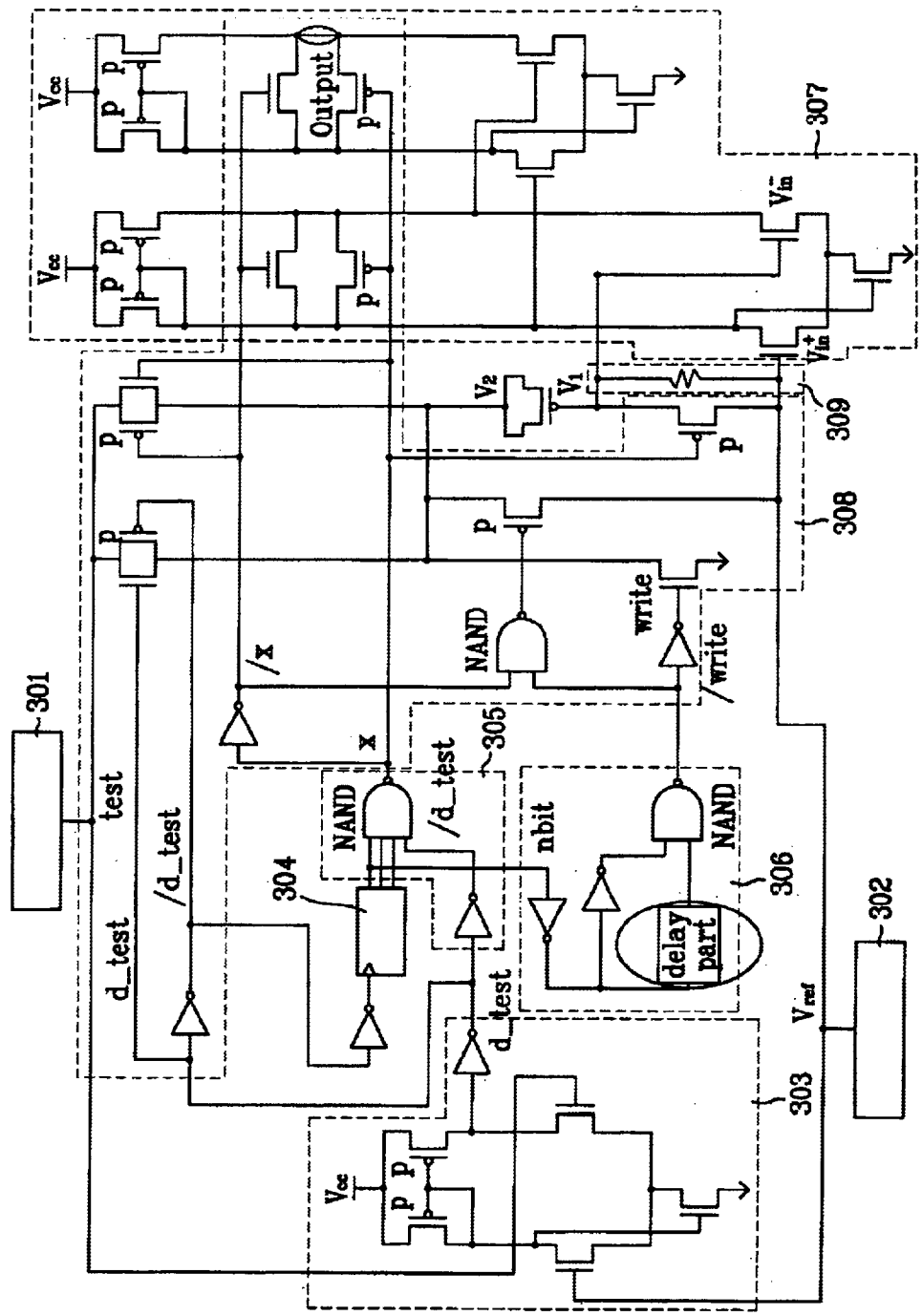

FIG. 20 illustrates a circuit diagram of the circuit in FIG. 19.

Referring to FIG. 20, the circuit is identical to the circuit for testing a ferroelectric capacitor of the present invention in FIG. 4, added with the sense resistor. The ferroelectric capacitor is a PMOS transistor having a gate connected to a negative input terminal $V^-_{in}$ of the amplification part 307, and source/drain for receiving the drive voltage Vdr of the input drive control part 308 in common. The test pulse providing part 303 has a circuit identical to one in FIG. 5, for receiving a test pulse signal 'test' as an input signal, and providing the digital test pulse signal d_test. The 3 bit down counter in FIG. 6 is employed as the n bit counter 304. The clock signal to the 3 bit down counter 304 is the digital test pulse signal d_test from the A-D converter 303. The 3 bit down counter provides signals for respective bits (1, 2, and 3 bits) asynchronous to the clock inversion signal '/d_test'. The signals from the 3 bit down counter transit from H-H-H to L-L-L. The measuring control signal providing part 305 has a circuit identical to one in FIG. 8, and provides a low level signal as the measuring control signal 'x' only in a case both the signals for respective bits (1, 2, and 3 bits), and the digital inversion signal 'd_test' are at high level, and provides a high level signal in other cases. The write pulse bar signal generating part 306 has a circuit identical to one in FIG. 9, for providing a write pulse bar signal '/write' to sustain a low level as much as a preset delay time period set at the delay part in response to a rising signal of the 3 bit signal. The two stage amplification part 307 has a circuit of the two stage amplification part identical to the measured result forwarding part in FIG. 12, for receiving the reference voltage Vref at the positive input terminal $V^+_{in}$, and the voltage signal from the first electrode $V_1$ of the ferroelectric capacitor at $V^-_{in}$, and making a differential amplification of a voltage difference between the positive, and negative input terminals $V^+_{in}$, and $V^-_{in}$, to provide an output. The input drive control part 308 has a circuit as shown in FIG. 13, for generating the drive voltage Vdr, and equalizing the positive, and negative output terminals $V^+_{out}$, and $V^-_{out}$. The drive voltage Vdr is provided in response to the digital test pulse signal d_test, the measuring control signal 'x', and the write pulse bar signal '/write'.

The sense resistor measures a current to the ferroelectric capacitor by measuring a voltage between the non-inversion input terminal, and an inversion input terminal $V^+_{in}$, and $V^-_{in}$ of the amplification part, and dividing by a resistance of the sense resistor. Such a current measurement is possible because a current to the input terminal is approx. '0' in view of characteristic of the amplification part. Therefore, if it is assumed that the currents to the non-inversion input terminal, and the inversion input terminal $V^+_{in}$, and $V^-_{in}$ are '0', the current to the sense resistor goes to the ferroelectric capacitor, entirely. Because the sense resistor, and one of the PMOS transistors are connected in parallel, to divide the current to the ferroelectric capacitor to flow to the sense resistor, and the PMOS transistor, the current to the sense resistor can be obtained by obtaining a voltage difference between the two, resistances of the two devices (the sense resistor, and the PMOS transistor), and calculating a ratio [I=(V+in−V−in)/(R‖ Rp), where R denotes the current to the sense resistor, Rp denotes the current to the PMOS transistor, and 'I' denotes the current to the first electrode of the ferroelectric capacitor].

The PMOS transistor connected to the sense resistor in parallel is provided so that the input drive control part controls equalizing between the negative, and positive terminals of the amplification part. The PMOS transistor has the same system, and function with the second PMOS transistor 84 in FIG. 13.

In FIG. 20, the PMOS transistor, serving as the ferroelectric capacitor having the gate connected to the inversion input terminal of the measured result forwarding part, and the source/drain connected to the drive voltage output terminal of the input drive control part, can be employed as the ferroelectric capacitor in the foregoing circuit for testing a voltage of the ferroelectric capacitor in an FRAM described before.

As has been explained, the circuit for testing a ferroelectric capacitor in an FRAM has the following advantages.

First, the circuit for testing a ferroelectric capacitor in an FRAM can be used as a circuit for measuring a voltage, or a current between electrodes of the ferroelectric capacitor by adding a particular device thereto.

Second, the foregoing circuit for testing a ferroelectric capacitor permits measurement of a variation of the ferroelectric capacitor within a minute range of time period, for an example, within a range of nano-second. That is, variations of characteristics of the ferroelectric capacitor having heavy degradation, and relaxation caused by imprint, and the like can be measured within a more minute time period range.

Third, accurate modeling parameters of the ferroelectric capacitor are made available as the characteristics of the ferroelectric capacitor are made available.

Fourth, prediction of a sensing margin, and a capacitance on a bitline can be made available by simulation of a circuit based on the modeling parameters of the ferroelectric capacitor made available.

It will be apparent to those skilled in the art that various modifications and variations can be made in the circuit for testing a ferroelectric capacitor in an FRAM of the present invention without departing from the spirit or scope of the invention. Thus, it is intended that the present invention cover the modifications and variations of this invention provided they come within the scope of the appended claims and their equivalents.

What is claimed is:

1. A circuit for testing a ferroelectric capacitor in a ferroelectric random access memory (FRAM) for storing a data at the ferroelectric capacitor, comprising:

a test pulse signal generating part for generating a test pulse signal for measuring variation of charge in the ferroelectric capacitor;

a test pulse providing part for digitizing the test pulse signal by using a reference voltage signal to provide a digital test pulse signal;

an n-bit counter for making a $2^n$ clock counting per a cycle in response to the digital test pulse signal as a clock signal;

a measuring control signal providing part for subjecting count outputs for each bit, and the digital test pulse signal to logic operation, to provide a measuring control signal;

a write pulse bar signal generating part for generating a write pulse bar signal in correspondence to a specific bit count output within a specific period;

an input drive control part for receiving the reference voltage signal, a voltage signal at the first electrode of the ferroelectric capacitor, the measuring control signal, the write pulse bar signal, and applying a driving voltage to a second electrode of the ferroelectric capacitor in response to the test pulse signal; and a measured result forwarding part for receiving the reference voltage signal, and the voltage signal from the first electrode at a non-inversion terminal, and an inversion terminal thereof respectively, and amplifying, and forwarding a voltage variation between the electrodes of the ferroelectric capacitor.

2. The circuit according to claim 1, wherein the drive voltage applied to the second electrode of the ferroelectric capacitor is the write pulse bar signal during a data write mode.

3. The circuit according to claim 1, wherein the drive voltage applied to the second electrode of the ferroelectric capacitor is the test pulse signal during a test mode.

4. The circuit according to claim 1, wherein the test pulse signal generating part may be disposed in the FRAM, or an outside of the FRAM, separately.

5. The circuit according to claim 1, wherein the reference voltage is an half of an external power source voltage.

6. The circuit according to claim 1, wherein the test pulse providing part includes an A-D converter for providing a high level signal if the test pulse signal is higher than the reference voltage, and a low level signal if the test pulse signal is lower than the reference voltage.

7. The circuit according to claim 6, wherein the A-D converter includes:

a first PMOS transistor connected to the power source voltage in a diode type;

a second PMOS transistor connected to the first PMOS transistor in a current mirror type;

a first NMOS transistor connected between a ground voltage, and a second node, and controlled by an output of a first node which is a drain terminal of the first PMOS transistor;

a second NMOS transistor connected between the first node, and the second node, and controlled by an output of the reference voltage;

a third NMOS transistor connected between a third node which is a drain terminal of the second PMOS transistor, and the second node, and controlled by the test pulse signal; and an inverter for inverting an output of the third node to provide the digital test pulse signal.

8. The circuit according to claim 1, wherein the n bit counter is a three bit counter.

9. The circuit according to claim 8, wherein the three bit counter includes:

a first J/K flipflop for receiving the power source voltage at J/K input terminals respectively, and providing an one bit signal in response to the clock signal;

a second J/K flipflop for receiving an inverted signal of the one bit signal at J/K input terminals respectively, and providing a two bit signal in response to the clock signal;

an NAND gate for subjecting an inverted signal of the one bit signal, and an inverted signal of the two bit signal to negative logical product operation;

an inverter for inverting an output from the NAND gate; and a third J/K flipflop for receiving an output from the inverter at J/K input terminals respectively, and providing a 3 bit signal in response to the clock signal.

10. The circuit according to claim 9, wherein each of the first, second, and the third J/K flipflop includes:

a first NAND gate for subjecting the clock signal, the J input signal, and the fed back negative output 'QB' to negative logical product;

a first inverter for inverting an output from the first NAND gate;

a second NAND gate for subjecting the clock signal, the K input signal, and the fed back positive output Q to logical product;

a second inverter for inverting an output of the second NAND gate;

a first NOR gate for subjecting an output from the first inverter, and the first signal to negative logic sum, to provide a second signal;

a second NOR gate for subjecting the second signal and an output from the second inverter to negative logic sum, to provide the first signal;

a third inverter for inverting the clock signal to provide an inverted clock signal;

a third NAND gate for subjecting the first signal, the inverted clock signal, and the power source signal to negative logic product;

a fourth inverter for inverting an output from the third NAND gate;

a fourth NAND gate for subjecting the second signal, the inverted clock signal, and the power source voltage signal to negative logic product;

a fifth inverter for inverting an output from the fourth NAND gate;

a third NOR gate for subjecting an output from the fourth inverter and the positive output to negative logic sum, to provide the negative output; and a fourth NOR gate for subjecting an output from the fifth inverter, and the negative output to negative logic sum, to provide the positive output.

11. The circuit according to claim 1, wherein the measuring control signal providing part serves to detect a time point when both n outputs of the n bit counter, and the inversion signal of the digital test pulse signal are at high.

12. The circuit according to claim 1, wherein the measuring control signal providing part includes an inverter for inverting the digital test pulse signal, to provide a digital inversion signal, and an NAND gate for subjecting the 'n' outputs from the n bit counter, and the digital inversion signal to negative logic product, to provide the measuring control signal.

13. The circuit according to claim 1, wherein the write pulse bar signal from the write pulse generating part is provided at a rising operation of the most significant bit of the n bit counter.

14. The circuit according to claim 13, wherein the write pulse bar signal generating part includes:

a first inverter for inverting the most significant bit output from the n bit counter;

a second inverter for inverting an output from the first inverter;

a delay part for delaying the output from the first inverter; and an NAND gate for subjecting an output from the second inverter and an output from the delay part to negative logic product, to provide a write pulse inverted signal.

15. The circuit according to claim 14, wherein the delay part includes a plurality of delay blocks connected in series each having an output terminal connected to a switching device, for applying a selection signal to one of the delay blocks for setting a delay time period, selectively.

16. The circuit according to claim 15, wherein the delay block includes:

a plurality of PMOS transistors connected in series from a power source voltage, and controlled by an input signal;

one NMOS transistor connected between a drain of a last PMOS transistor among the plurality of PMOS transistors, and a ground power source; and an inverter for inverting an output from a contact point between the last PMOS transistor and the NMOS transistor.

17. The circuit according to claim 1, wherein the write pulse bar signal has a width varied within a ½ clock of the digital test pulse signal.

18. The circuit according to claim 1, wherein the measured result forwarding part includes a first amplification part for receiving the reference voltage, and a voltage at the first electrode of the ferroelectric capacitor, for sensing a voltage variation between electrodes of the ferroelectric capacitor, and a second amplification part for providing a result of amplification at the first amplification part to outside of the circuit without any noise source.

19. The circuit according to claim 18, wherein each of the first, and second amplification parts include:

a first PMOS transistor connected in a diode type from the power source voltage;

a second PMOS transistor connected to the first PMOS transistor in a current mirror type;

a first NMOS transistor connected between a third node B3, and a ground power source, and controlled by an output from a first node which is a drain of the first PMOS transistor;

a second NMOS transistor connected between the first node and the third node, and controlled by the reference voltage; and a third NMOS transistor connected between a second node which is a drain terminal of the second PMOS transistor, and the third node, and controlled by a voltage of the first electrode of the ferroelectric capacitor.

20. The circuit according to claim 19, wherein the second NMOS transistor has a gate serving as a non-inversion input terminal of the first, and second amplification parts, and the third NMOS transistor has a gate serving as an inversion input terminal of the first, and second amplification parts.

21. The circuit according to claim 19, wherein the first node serves as a non-inversion output terminal of the first, and second amplification parts, and the second node serves as a inversion output terminal of the first, and second amplification parts.

22. The circuit according to claim 21, wherein the first amplification part has a non-inversion output terminal connected to a non-inversion input terminal of the second amplification part, and the first amplification part has an inversion output terminal connected to an inversion input terminal of the second amplification part.

23. The circuit according to claim 1, wherein the input drive control part includes a drive voltage generating part for providing the drive voltage to the second electrode of the ferroelectric capacitor, and a equalizing control part for making equalizing control between the non-inversion, and an inversion input terminals of the amplification part.

24. The circuit according to claim 23, wherein the drive voltage generating part includes:

a first inverter for inverting the digital test pulse signal to provide a digital inversion signal;

a first transfer gate having an NMOS transistor with the digital test pulse signal applied thereto, and a PMOS transistor with the digital inversion signal applied thereto, for providing the test pulse signal to a second electrode of the ferroelectric capacitor when the first transfer gate is turned on;

a second inverter for inverting a measuring control signal to provide a control inversion signal;

a second transfer gate having a PMOS transistor with the control inversion signal applied thereto, and an NMOS transistor with the measuring control signal applied thereto, for providing the test pulse signal to a second electrode of the ferroelectric capacitor when the second transfer gate is turned on;

an NAND gate for subjecting the control inversion signal, and the write pulse bar signal to negative logic product;

a third inverter for inverting the write pulse bar signal to provide a write pulse signal;

an NMOS transistor connected between the second electrode of the ferroelectric capacitor and the ground voltage, and controlled by the write pulse signal; and a PMOS transistor connected between the second electrode of the ferroelectric capacitor and the reference voltage application terminal, and controlled by an output from the NAND gate.

25. The circuit according to claim 23, wherein the equalizing control part includes:

a second PMOS transistor connected between a reference voltage application terminal, and the second electrode of the ferroelectric capacitor, and controlled by the measuring control signal;

a third PMOS transistor, and a second NMOS transistor connected between the positive, and negative output terminals of the first amplification part, and controlled by the measuring control signal; and a fourth PMOS transistor, and a third NMOS transistor connected between the positive, and negative output terminals of the second amplification part, and controlled by the control inverted signal.

26. The circuit according to claim 1, wherein the ferroelectric capacitor includes a PMOS transistor having a gate connected to a negative input terminal of the amplification part, and source/drain for receiving the drive voltage from the input drive part in common.

27. A circuit for testing a ferroelectric capacitor in an FRAM for storing data in the ferroelectric capacitor, comprising:

a test pulse signal generating part for generating a test pulse signal for measuring variation of charge in the ferroelectric capacitor;

a test pulse providing part for digitizing the test pulse signal by using a reference voltage signal to provide a digital test pulse signal;

an n-bit counter for making a $2^n$ clock counting per a cycle in response to the digital test pulse signal as a clock signal;

a measuring control signal providing part for subjecting count outputs for each bit, and the digital test pulse signal to logic operation, to provide a measuring control signal;

a write pulse bar signal generating part for generating a write pulse bar signal in correspondence to a specific bit output within a specific period;

an input drive control part for receiving the reference voltage signal, a voltage signal of the first electrode of the ferroelectric capacitor, the measuring control signal, and the write pulse bar signal, and providing a drive voltage to a second electrode of the ferroelectric capacitor in response to the test pulse signal;

a measured result forwarding part for receiving the reference voltage signal, and the voltage signal from the first electrode at a non-inversion terminal, and an inversion terminal thereof respectively, and amplifying, and forwarding a voltage variation between the electrodes of the ferroelectric capacitor; and a sense capacitor connected between the first electrode of the ferroelectric capacitor, and the measured result forwarding part for sensing voltage variation of the ferroelectric capacitor.

28. The circuit according to claim 27, wherein the measured result providing part includes a first amplification part for receiving the reference voltage, and the voltage from the first electrode of the ferroelectric capacitor, for sensing, and amplifying voltage variation between electrodes of the ferroelectric capacitor, and a second amplification part for providing a result amplified at the first amplification part without any noise source to outside of the circuit.

29. The circuit according to claim 28, wherein the sense capacitor includes a first electrode connected to a contact point of the first electrode of the ferroelectric capacitor, and the inversion input terminal, and a second electrode connected to an output terminal of the first amplification part.

30. The circuit according to claim 29, wherein the sense capacitor includes a first PMOS transistor having a gate connected to a contact point of the first electrode of the ferroelectric capacitor, and the inversion input terminal, and source/drain connected to an output terminal of the first amplification part, and a second PMOS transistor having a gate connected to an output terminal of the first amplification part, and source/drain connected to a contact point of the first electrode of the ferroelectric capacitor, and the inversion input terminal.

31. A circuit for testing a ferroelectric capacitor in an FRAM for storing data in the ferroelectric capacitor, comprising:

a test pulse signal generating part for generating a test pulse signal for measuring variation of charge in the ferroelectric capacitor;

a test pulse providing part for digitizing the test pulse signal by using a reference voltage signal to provide a digital test pulse signal;

an n-bit counter for making a $2^n$ clock counting per a cycle in response to the digital test pulse signal as a clock signal;

a measuring control signal providing part for subjecting count outputs for each bit, and the digital test pulse signal to logic operation, to provide a measuring control signal;

a write pulse bar signal generating part for generating a write pulse bar signal in correspondence to a specific bit output within a specific period;

an input drive control part for receiving the reference voltage signal, a voltage signal of the first electrode of the ferroelectric capacitor, the measuring control signal, and the write pulse bar signal, and providing a drive voltage to a second electrode of the ferroelectric capacitor in response to the test pulse signal;

a measured result forwarding part for receiving the reference voltage signal, and the voltage signal from the first electrode at a non-inversion terminal, and an inversion terminal thereof respectively, and amplifying, and forwarding a voltage variation between the electrodes of the ferroelectric capacitor; and a sense resistor connected between the non-inversion terminal, and the inversion terminal of the amplification part.

32. The circuit according to claim 31, wherein the voltage between the non-inversion terminal, and the inversion terminal of the amplification part is divided by a resistance of the sense resistor, for obtaining a current value to the ferroelectric capacitor.

* * * * *